United States Patent
Papandreou et al.

(10) Patent No.: US 11,334,492 B2
(45) Date of Patent: May 17, 2022

(54) CALIBRATING PAGES OF MEMORY USING PARTIAL PAGE READ OPERATIONS

(71) Applicant: International Business Machines Corporation, Armonk, NY (US)

(72) Inventors: Nikolaos Papandreou, Thalwil (CH); Charalampos Pozidis, Thalwil (CH); Roman Alexander Pletka, Uster (CH); Sasa Tomic, Kilchberg (CH); Nikolas Ioannou, Zurich (CH); Radu Ioan Stoica, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 16/663,211

(22) Filed: Oct. 24, 2019

(65) Prior Publication Data

US 2021/0124685 A1   Apr. 29, 2021

(51) Int. Cl.
*G06F 12/08* (2016.01)
*G06F 12/0882* (2016.01)
*G06F 12/02* (2006.01)
*G06F 11/07* (2006.01)
*G11C 11/409* (2006.01)
*G06F 12/06* (2006.01)

(52) U.S. Cl.
CPC ........ *G06F 12/0882* (2013.01); *G06F 11/076* (2013.01); *G06F 12/0246* (2013.01); *G06F 12/0646* (2013.01); *G11C 11/409* (2013.01); *G11C 2207/2254* (2013.01)

(58) Field of Classification Search
CPC ............. G06F 12/0882; G06F 12/0646; G06F 12/0246; G06F 11/076; G11C 11/409; G11C 2207/2254

USPC ......................................................... 711/103
See application file for complete search history.

(56) References Cited

U.S. PATENT DOCUMENTS

| | | |
|---|---|---|
| 8,943,387 B2 | 1/2015 | Murray et al. |
| 9,183,085 B1 | 11/2015 | Northcott |
| 9,672,940 B1 | 6/2017 | Reusswig et al. |
| 9,720,754 B2 | 8/2017 | Karakulak et al. |
| 2014/0082264 A1 | 3/2014 | Wan et al. |
| 2017/0271031 A1 | 9/2017 | Sharon et al. |
| 2018/0024881 A1 | 1/2018 | Lu |
| 2019/0066802 A1* | 2/2019 | Malshe ............... G11C 16/349 |

(Continued)

OTHER PUBLICATIONS

U.S. Appl. No. 16/109,689, filed Aug. 22, 2018.

*Primary Examiner* — Hua J Song
(74) *Attorney, Agent, or Firm* — Zilka-Kotab, P.C.

(57) ABSTRACT

A computer-implemented method, according to one embodiment, is for calibrating read voltages for a block of memory. The computer-implemented method includes: determining a calibration read mode of the block, and using the calibration read mode to determine whether pages in the block should be read using full page read operations. In response to determining that the pages in the block should not be read using full page read operations, a current value of a partial page read indicator for the block is determined. The block is further calibrated by reading only a portion of each page in the block, where the current value of the partial page read indicator determines which portion of each respective page in the block is read. Moreover, the current value of the partial page read indicator is incremented.

18 Claims, 16 Drawing Sheets

(56) References Cited

U.S. PATENT DOCUMENTS

2019/0102097 A1 4/2019 Madraswala et al.
2019/0205043 A1 7/2019 Huang et al.
2021/0133025 A1* 5/2021 Aklik .................. G06F 11/1048

* cited by examiner

CALIBRATING PAGES OF MEMORY USING PARTIAL PAGE READ OPERATIONS

BACKGROUND

The present invention relates to data storage systems, and more particularly, this invention relates to calibrating read voltages for pages of memory using partial page read operations.

NVRAM is a type of random-access memory which retains information stored thereon even after the power supply is turned off, and includes a number of different forms. Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program/erase (P/E) cycling, charge leakage over time (i.e., data retention), and additional charge placed in the cells by read or program operations (i.e., read or program disturb errors, respectively). Typically, a Flash memory block is retired when any page in the block exhibits a code word that reaches a page retirement error count limit. This limit is typically set to be achieved in conjunction with an appropriate error correction code (ECC), resulting in the Uncorrectable Bit Error Rate (UBER) after applying the ECC for a Flash memory block being set to be similar to the UBER in traditional hard disk drives, e.g., at around $10^{-15}$, but may be more or less.

Block and/or page calibration, which refers to algorithms that adjust read voltages, has been shown to significantly improve the RBER and therefore enhance endurance and retention, particularly for enterprise-level Flash memory systems using modern three-dimensional (3-D) triple-level-cell (TLC) or quad-level-cell (QLC) NAND Flash memory. Previous attempts to maintain efficient memory performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects.

SUMMARY

A computer-implemented method, according to one approach, is for calibrating read voltages for a block of memory. The computer-implemented method includes: determining a calibration read mode of the block, and using the calibration read mode to determine whether pages in the block should be read using full page read operations. In response to determining that the pages in the block should not be read using full page read operations, a current value of a partial page read indicator for the block is determined. The block is further calibrated by reading only a portion of each page in the block, where the current value of the partial page read indicator determines which portion of each respective page in the block is read. Moreover, the current value of the partial page read indicator is incremented.

A computer program product, according to another approach, is for calibrating read voltages for a block of memory. The computer program product includes a computer readable storage medium having program instructions embodied therewith. Moreover, the program instructions readable and/or executable by a processor to cause the processor to: perform the foregoing method.

A system, according to yet another approach, includes: a plurality of non-volatile random access memory (NVRAM) blocks configured to store data, a processor, and logic integrated with and/or executable by the processor. The logic is configured to, for each of the blocks: perform the foregoing method.

Other aspects and approaches of the present invention will become apparent from the following detailed description, which, when taken in conjunction with the drawings, illustrate by way of example the principles of the invention.

DETAILED DESCRIPTION

Figure 1:
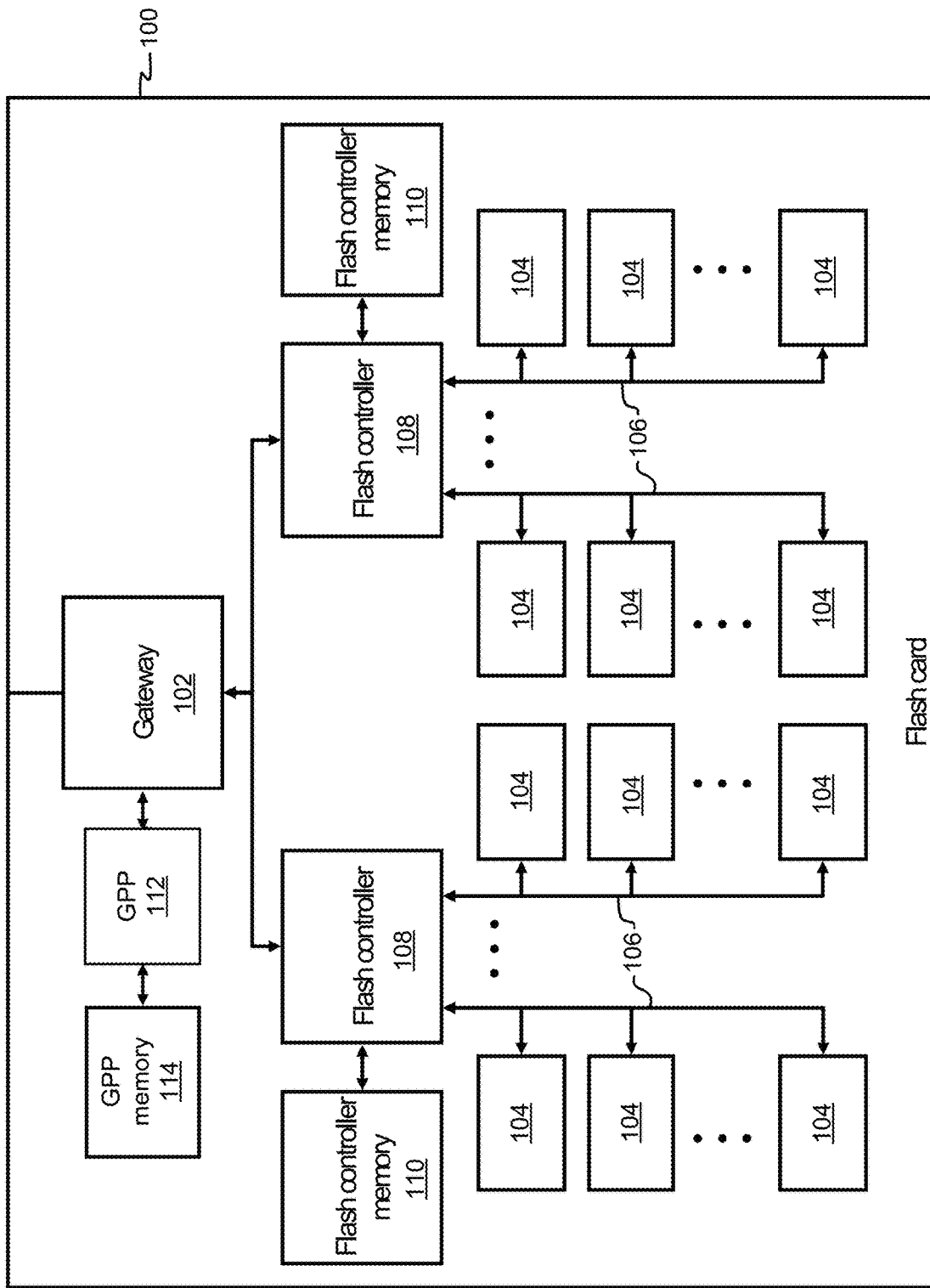
FIG. 1 is a diagram of a non-volatile memory card, in accordance with one approach.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several approaches of data storage systems, as well as operation and/or component parts thereof. It should be appreciated that various approaches herein can be implemented with a wide range of memory mediums, including for example NVRAM technologies such as NAND Flash memory, NOR Flash memory, phase-change memory (PCM), magnetoresistive RAM (MRAM) and resistive RAM (RRAM). To provide a context, and solely to assist the reader, various approaches may be described with reference to a type of non-volatile memory. This has been done by way of example only, and should not be deemed limiting on the invention defined in the claims.

In one general approach, a computer-implemented method is for calibrating read voltages for a block of memory. The computer-implemented method includes: determining a calibration read mode of the block, and using the calibration read mode to determine whether pages in the block should be read using full page read operations. In response to determining that the pages in the block should not be read using full page read operations, a current value of a partial page read indicator for the block is determined. The block is further calibrated by reading only a portion of each page in the block, where the current value of the partial page read indicator determines which portion of each respective page in the block is read. Moreover, the current value of the partial page read indicator is incremented.

In another general approach, a computer program product is for calibrating read voltages for a block of memory. The computer program product includes a computer readable storage medium having program instructions embodied therewith. Moreover, the program instructions readable and/or executable by a processor to cause the processor to: perform the foregoing method.

In yet another general approach, a system includes: a plurality of non-volatile random access memory (NVRAM) blocks configured to store data, a processor, and logic integrated with and/or executable by the processor. The logic is configured to, for each of the blocks: perform the foregoing method.

FIG. 1 illustrates a memory card 100, in accordance with one approach. It should be noted that although memory card 100 is depicted as an exemplary non-volatile data storage card in the present approach, various other types of non-volatile data storage cards may be used in a data storage system according to alternate approaches. It follows that the architecture and/or components of memory card 100 are in no way intended to limit the invention, but rather have been presented as a non-limiting example.

Moreover, as an option, the present memory card 100 may be implemented in conjunction with features from any other approach listed herein, such as those described with reference to the other FIGS. However, such memory card 100 and others presented herein may be used in various applications and/or in permutations which may or may not be specifically described in the illustrative approaches listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various approaches, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various approaches.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various approaches described herein. However, depending on the desired approach, the controller memory 110 may be battery-backed DRAM, phase-change memory PC-RAM, MRAM, STT-MRAM, etc., or a combination thereof.

Figure 2:
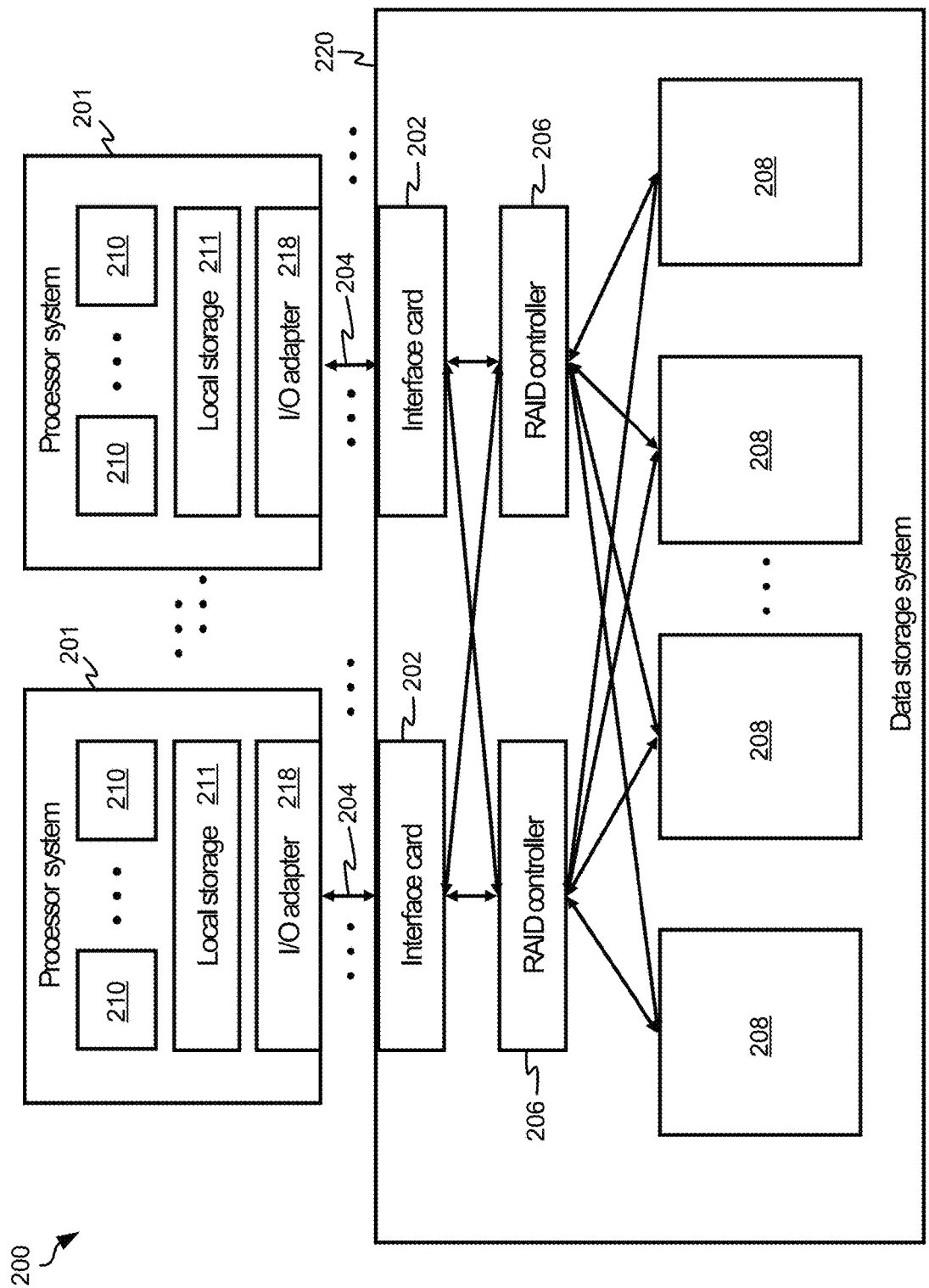
FIG. 2 is a diagram of a data storage system architecture, in accordance with one approach.

As previously mentioned, memory card 100 may be implemented in various types of data storage systems, depending on the desired approach. FIG. 2 illustrates a data storage system architecture 200 according to an exemplary approach which is in no way intended to limit the invention. Moreover, it should be noted that the data storage system 220 of FIG. 2 may include various components found in the approach of FIG. 1.

Looking to FIG. 2, the data storage system 220 comprises a number of interface cards 202 configured to communicate via I/O interconnections 204 to one or more processor systems 201. The data storage system 220 may also comprise one or more Redundant Array of Independent Disks (RAID) controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-6, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1014 of FIG. 10, ROM 1016 of FIG. 10, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired approach. Specifically, memory controllers may include logic configured to perform any one or more of the following functions, which are in no way intended to be an exclusive list. In other words, depending on the desired approach, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logical erase blocks (LEBs) may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or Flash channels are grouped together, such that blocks from the same group can be read or written in parallel, thereby increasing overall bandwidth. It is also possible to combine the previous two methods, and to compose RAID stripes using blocks from different Flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary approach, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the logical to physical table (LPT) mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some approaches. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, write heat segregation may be achieved. In particular, write heat segregating methods may group write hot memory pages together in certain memory blocks while write cold memory pages are grouped together in separate memory blocks. Thus, a write heat segregated LEB tends to be occupied by either write hot or cold data.

The merit of write heat segregation is two-fold. First, performing a garbage collection process on a write hot memory block will prevent triggering the relocation of write cold data as well. In the absence of heat segregation, updates to write hot data, which are performed frequently, also results in the undesirable relocations of all write cold data collocated on the same LEB as the hot data being relocated. Therefore, the write amplification incurred by performing garbage collection is much lower for approaches implementing write heat segregation.

Secondly, the relative write heat of data can be utilized for wear leveling purposes. For example, write hot data may be placed in healthier (e.g., younger) memory blocks, while write cold data may be placed on less healthy (e.g., older) memory blocks relative to those healthier memory blocks. Thus, the rate at which relatively older blocks are exposed to wear is effectively slowed, thereby improving the overall endurance of a given data storage system implementing write heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired approach, logic of a storage system may be configured to perform additional or alternative functions, as would be appreciated by one skilled in the art upon reading the present description.

Figure 3:
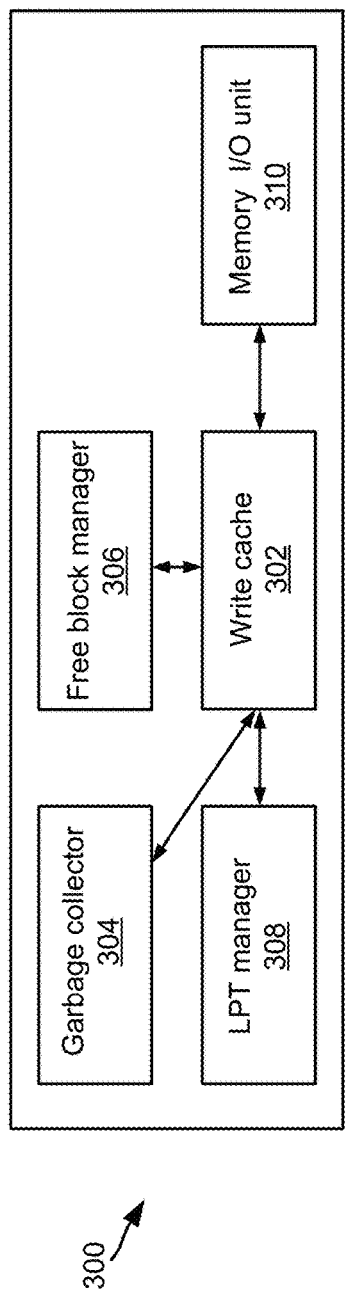
FIG. 3 is a system diagram, in accordance with one approach.

Referring now to FIG. 3, a system 300 is illustrated in accordance with one approach. As an option, the present system 300 may be implemented in conjunction with features from any other approach listed herein, such as those described with reference to the other FIGS. However, such system 300 and others presented herein may be used in various applications and/or in permutations which may or may not be specifically described in the illustrative approaches listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired approach. According to an exemplary approach, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages of memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

Figure 4A:
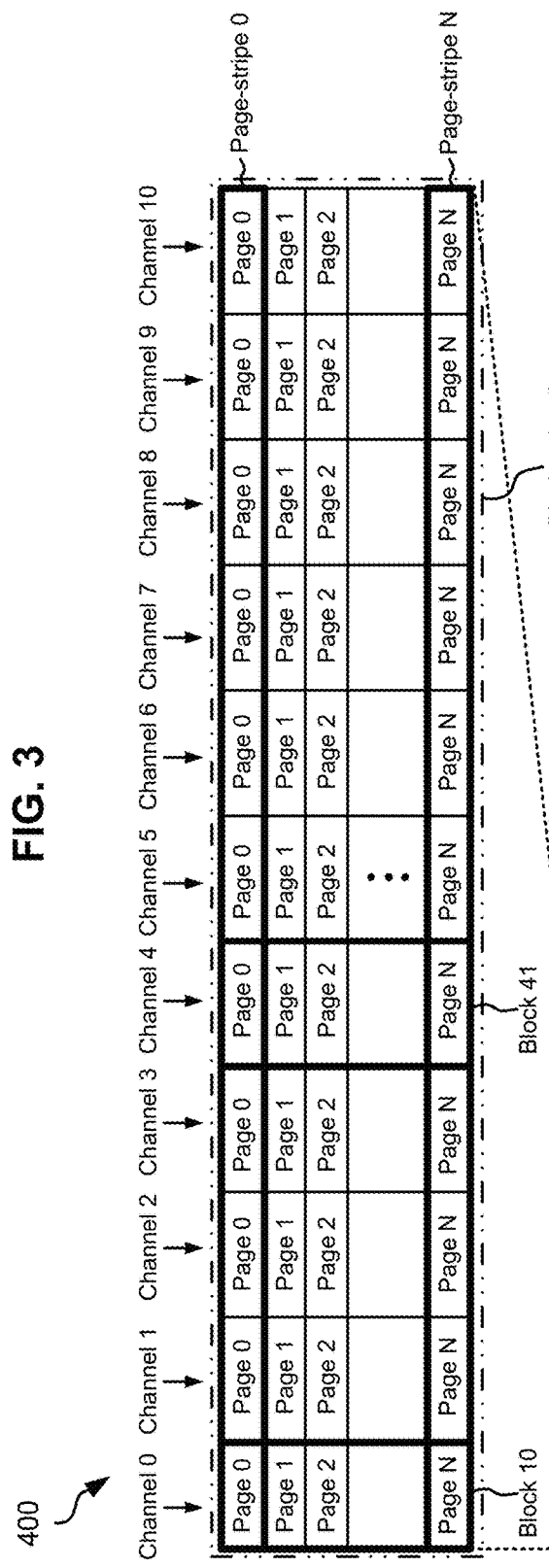
FIG. 4A is a conceptual diagram which includes a block-stripe and page-stripe, in accordance with one approach.

To better understand the distinction between block-stripes and page-stripes as used herein, FIG. 4A is a conceptual diagram 400, in accordance with one approach. LEBs are built from block stripes and typically a single block stripe is used to build a LEB. However, alternative approaches may use multiple block stripes to form an LEB. As an option, the present conceptual diagram 400 may be implemented in conjunction with features from any other approach listed herein, such as those described with reference to the other FIGS. However, such conceptual diagram 400 and others presented herein may be used in various applications and/or in permutations which may or may not be specifically described in the illustrative approaches listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired approach, the conceptual diagram 400 of FIG. 4A may be implemented in defining the organization of data stored in non-volatile memory. Accordingly, both implementations are described in turn below.

Non-Volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given approach of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some approaches one or more blocks of a block-stripe may belong to different physical planes. It follows that each aggregated plane may include one or more block-stripe. Thus, according to an illustrative approach, Block 0 through Block 10 from different physical planes may constitute a block-stripe.

Regardless of whether the conceptual diagram 400 of FIG. 4A is implemented with non-volatile memory and/or a cache architecture, in different approaches, the number of pages in each block and/or the number of channels in each plane may vary depending on the desired approach. According to an exemplary approach, which is in no way intended to limit the invention, a block may include 1024 pages, but could include more or less in various approaches. Analogously, the number of channels per plane and/or the number of planes may vary depending on the desired approach.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4A:
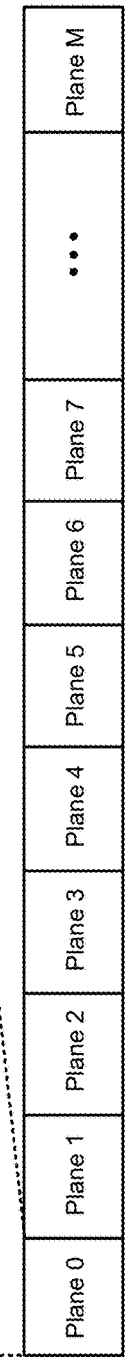
Figure 4B:
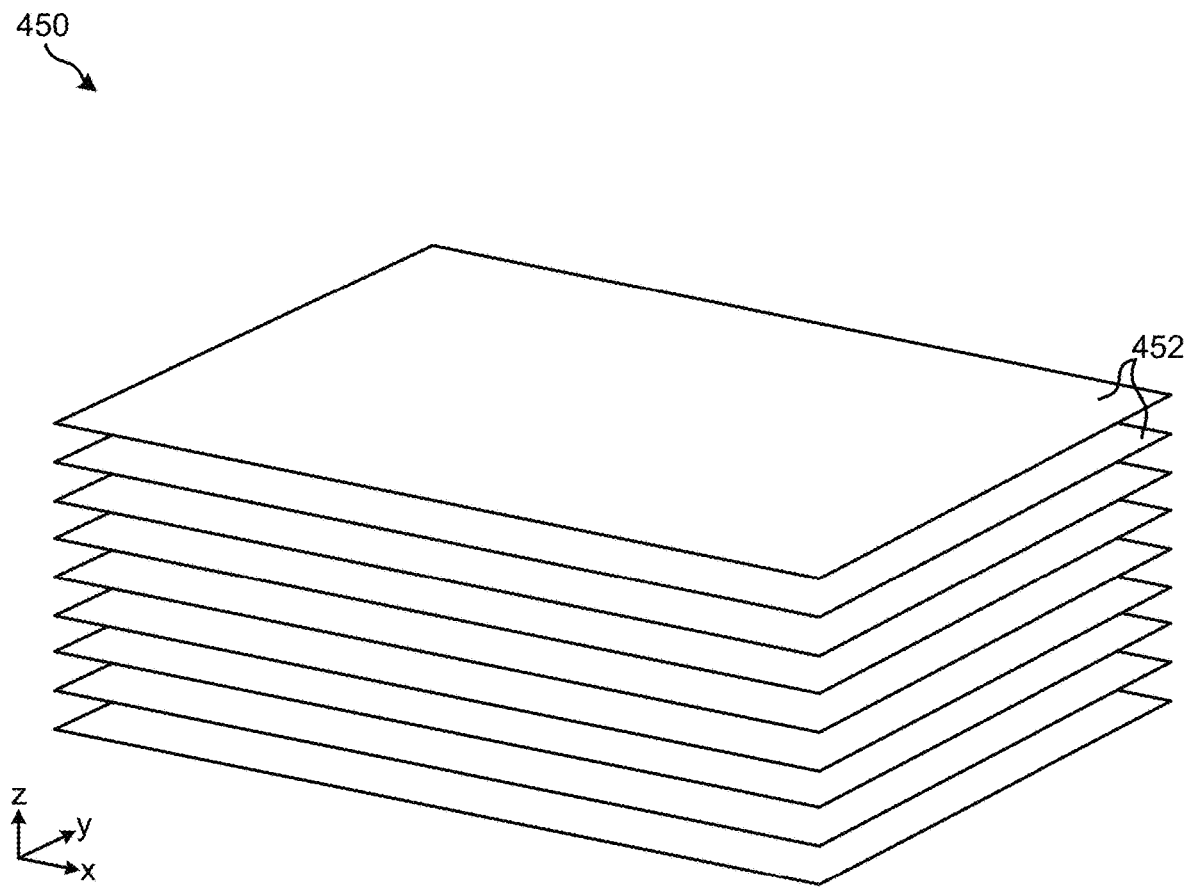
FIG. 4B is a partial perspective view of a 3-D non-volatile memory structure, in accordance with one approach.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one approach. As an option, the present structure 450 may be implemented in conjunction with features from any other approach listed herein, such as those described with reference to the other FIGS., such as FIG. 4A. However, such structure 450 and others presented herein may be used in various applications and/or in permutations which may or may not be specifically described in the illustrative approaches listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency. Cells from different bitlines along a word-line (typically in the x or y dimension of FIG. 4B) are logically combined to form pages. Thus, each block includes more than one word-line therein, and each word-line has more than one read voltage associated therewith. For example, in TLC, each word-line in a block contains 3 physical pages (e.g., a lower page, an upper page, and an extra page) and a word-line typically belongs to one particular layer in the z dimension (perpendicular to the x-y plane).

For a particular block, which is formed from a grid of cells connected by word-lines and bit-lines, the number of word-lines residing on the same layer is typically small. Therefore, a block can be formed from word-lines of all layers 452. Moreover, word-lines as well as pages in the same block may reside on different layers 452. It should also be noted that a block includes more than one type of page therein (e.g., upper page, lower page, extra page, top page), and at least one read voltage is associated with each of the page types, e.g., as would be appreciated by one skilled in the art after reading the present description.

Again, due to cycling, retention, read disturb, program disturb, etc., or other mechanisms that may be specific to the 3-D NAND Flash technology (e.g., floating gate based or charge trap based technology), process technology, cell and material design, circuit and array architecture, etc., or other specific design factors, the programmed threshold voltage distributions in the memory block may change with writing and erasing data (cycling), reading data (read disturb), time (retention), etc., in a relatively slow or fast manner. In other words, the RBER of Flash memory blocks increases with time and use. As memory blocks are used, each P/E cycle performed on the blocks causes damage of the memory cells, which in turn increases the corresponding RBER.

Block calibration is an important aspect of enhancing endurance and retention for Flash storage systems, e.g., particularly enterprise-level Flash systems, by reducing the RBER experienced. This block calibration corresponds to the read voltages and refers to algorithms that are able to track the changes of the threshold voltage distributions and adjust the read voltages accordingly, thereby significantly reducing the bit errors and improving the performance consistency in the respective device by reducing read tail latency which would otherwise result from error recovery mechanism invocations.

Moreover, adjustments to the read voltages are applied during a read command accordingly. It follows that the threshold voltage represents the voltage associated with turning on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
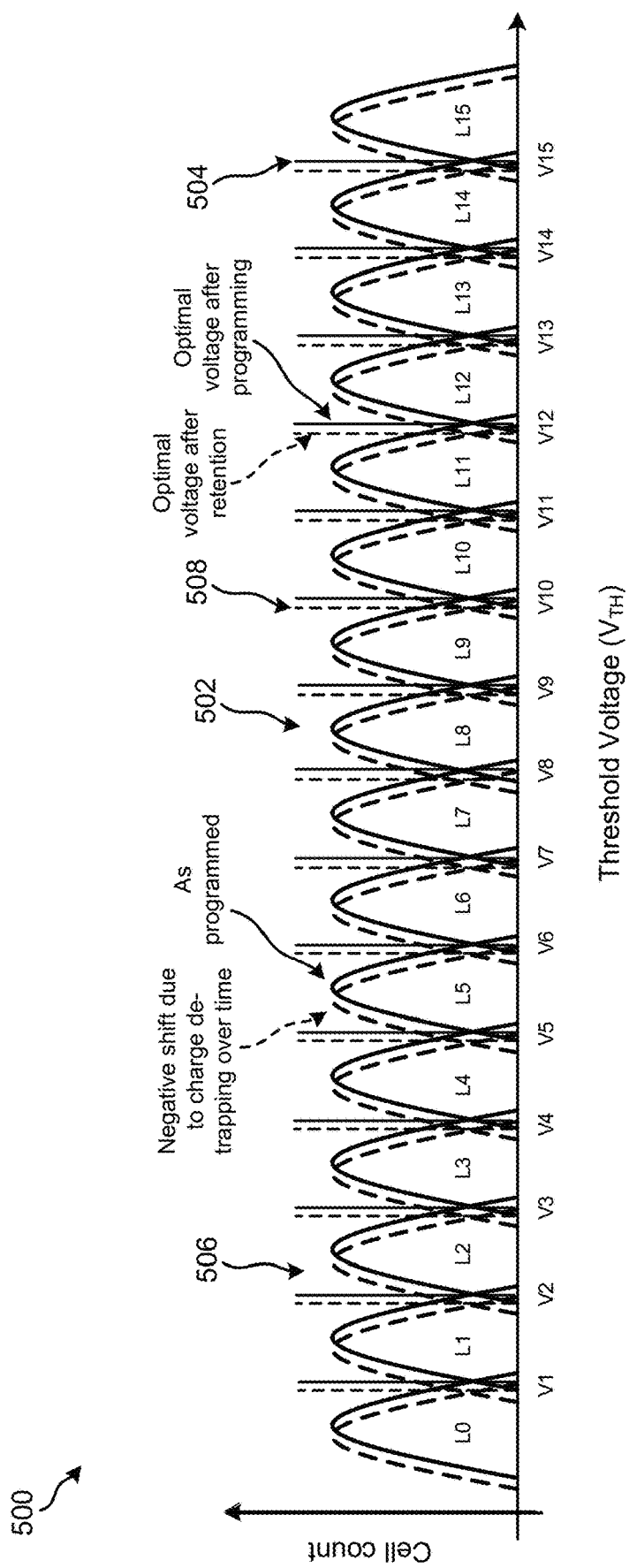
FIG. 5 is a graph which illustrates the threshold voltage shifting phenomenon, in accordance with one approach.

Referring momentarily to FIG. 5, a graph 500 illustrating the threshold voltage shifting phenomenon is illustrated in accordance with an example. The x-axis of the graph 500 represents the programmed threshold voltage VTH, while the y-axis represents the corresponding cell count of a QLC NAND Flash memory block. In QLC NAND Flash memory, each memory cell stores 4 bits of information, therefore, the VTH distributions correspond to 16 possible discrete levels (L0, L1, . . . , L15). Moreover, each different type of page in a given block of QLC NAND Flash has a different set of the read voltages which correspond thereto. According to an example, which is in no way intended to limit the invention, a lower page corresponds to the V8 read voltage, an upper page corresponds to the V4 and V12 read voltages, an extra page corresponds to the V2, V6, V10, and V14 read voltages, while a top page corresponds to the V1, V3, V5, V7, V9, V11, V13 and V15 read voltages.

The solid distributions 502 indicate the VTH levels after programming. The vertical solid lines 504 indicate the read voltages (V1, . . . , V15) that are optimal for the VTH distributions 502. The dashed distributions 506 indicate a negative shift of the VTH levels due to charge loss over time. Because of this negative shift to lower voltages, the read voltages 504 are no longer optimal. Indeed, a negative offset must be applied to the read voltages in order to account for the changes of the VTH distributions from 502 to 506. The vertical dashed lines 508 indicate the read voltages (V1, . . . , V15) that are optimal during retention for the VTH distributions in 506. In general, each of the 16 levels (L0, L1, . . . , L15) shown in the figure may have a different VTH shift and thus, each of the 15 read voltages (V1, . . . , V15) may have a different optimal shift.

Accordingly, the read voltage shift values (or offset values) are preferably determined shortly after a block has been written to and/or periodically thereafter. The threshold voltage can be considered an index of the cell programmed level (i.e., L0, L1, . . . , L15), as determined by measuring the source-drain current when a control gate bias is applied to the memory cell. Typically, upon a read operation, one or more read voltages between adjacent nominal threshold voltage levels are used to determine the memory cell state. As the threshold voltage value of the memory cell changes (as explained above), the read voltages applied during a read operation are preferably shifted accordingly using a set of offset values to obtain optimal readout conditions and minimize the RBER. Subsequently, the optimal read voltage shift values may be updated periodically, e.g., in a background health check, or on demand, e.g., in the event of high bit error count or ECC failure.

Although increases to RBERs are irreparable for some blocks (e.g., such as those caused by prolonged P/E cycles), increases to RBERs caused by events such as retention and/or read disturbances are transient in the sense that the blocks which are affected are not irreversibly damaged. This unfavorable increase in RBERs is remedied when the corresponding memory blocks are recalibrated such that the corresponding read voltages are corrected. In other approaches, blocks experiencing transient RBER increases may be remedied by being erased, programmed, and recalibrated. It is therefore apparent that the RBER of the block depends on the state of the block, which may be determined by the cycling state, the retention state, the read disturb state and/or any combinations thereof. Block recalibration improves the RBER by adjusting the read voltages so that they are optimal under the various changes of the VTH distributions under permanent effects and/or transient effects.

Ideally, the read voltages for each page in a block of memory are updated individually. However, as the storage capacity of memory increases, the amount of storage consumed by maintaining a read voltage offset value for each page in each block of memory increases as well. For instance, advancing from 3 bits per cell in TLC NAND Flash memory to 4 bits per cell in QLC NAND Flash memory, each block implements 16 threshold voltage levels (instead of 8 in TLC), and 15 different read voltages (instead of 7 in TLC) to read any of the pages included therein. Moreover, with the improvements in vertical stacking and process technology, the number of layers in every new generation of 3-D NAND Flash increases as well. Subsequently, the number of pages in each block also increases. For example, current 3-D QLC NAND Flash memory may have more than 90 layers and each block may have more than 4000 pages.

It follows that the number of background page read operations that are performed in order to calibrate a given block of memory has increased substantially, thereby also increasing the amount of read latency and read overhead experienced during the calibration process. These undesirable increases in read latency as well as the number of read operations performed have caused conventional calibration procedures to become increasingly inefficient, thereby degrading performance of the memory as a whole.

In sharp contrast to these conventional shortcomings, various ones of the approaches included herein are able to significantly reduce read latency which is particularly desirable in the context of performing memory calibration processes. Some of the approaches included herein are also able to detect abnormally performing pages and/or blocks of memory, thereby further improving read performance and overall memory function. These improvements are achieved in some approaches as a result of selectively reading portions of each page of memory rather than the entire page, e.g., as will be described in further detail below.

Figure 6A:
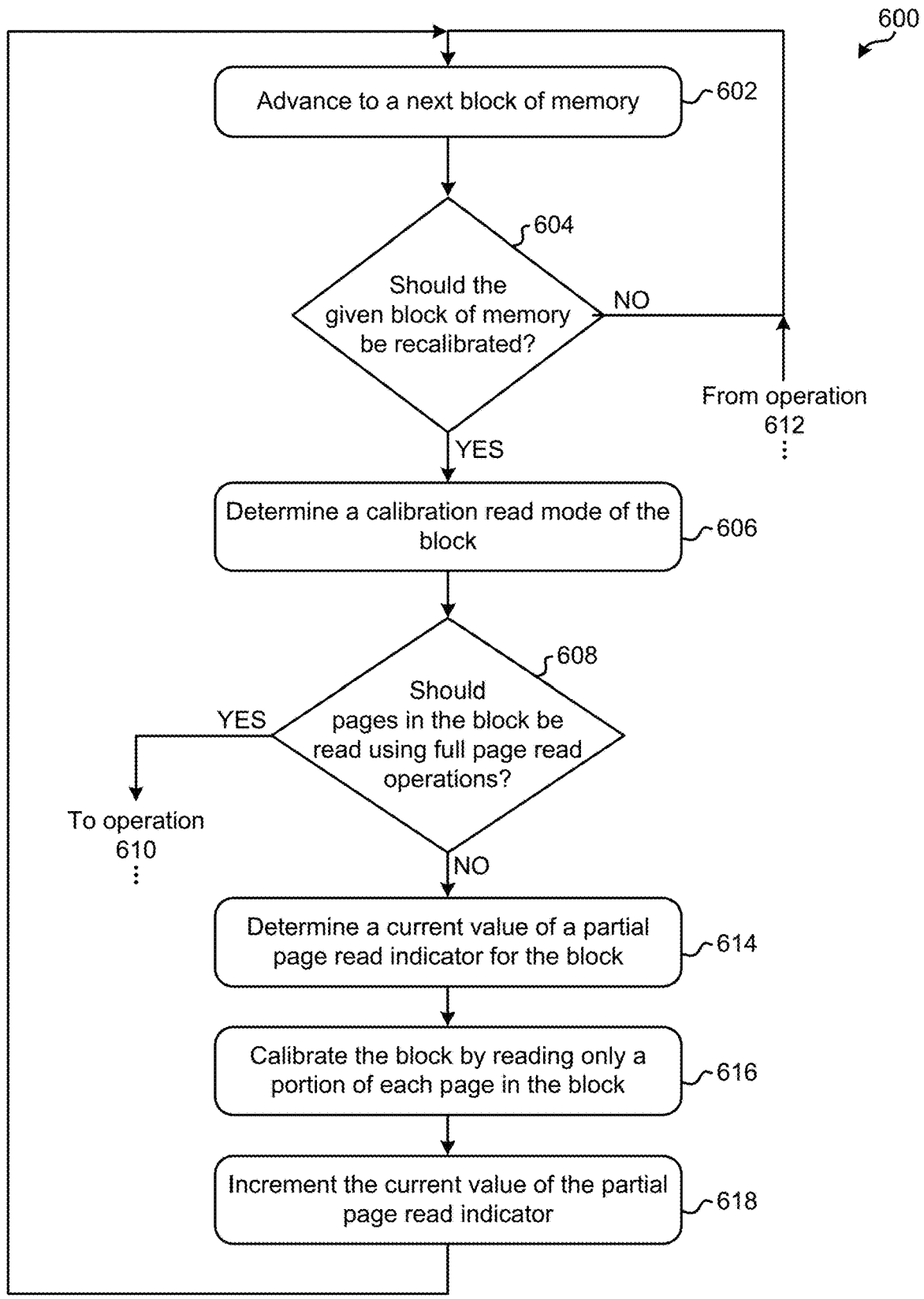
FIG. 6A is a flowchart of a method, in accordance with one approach.
Figure 6A:
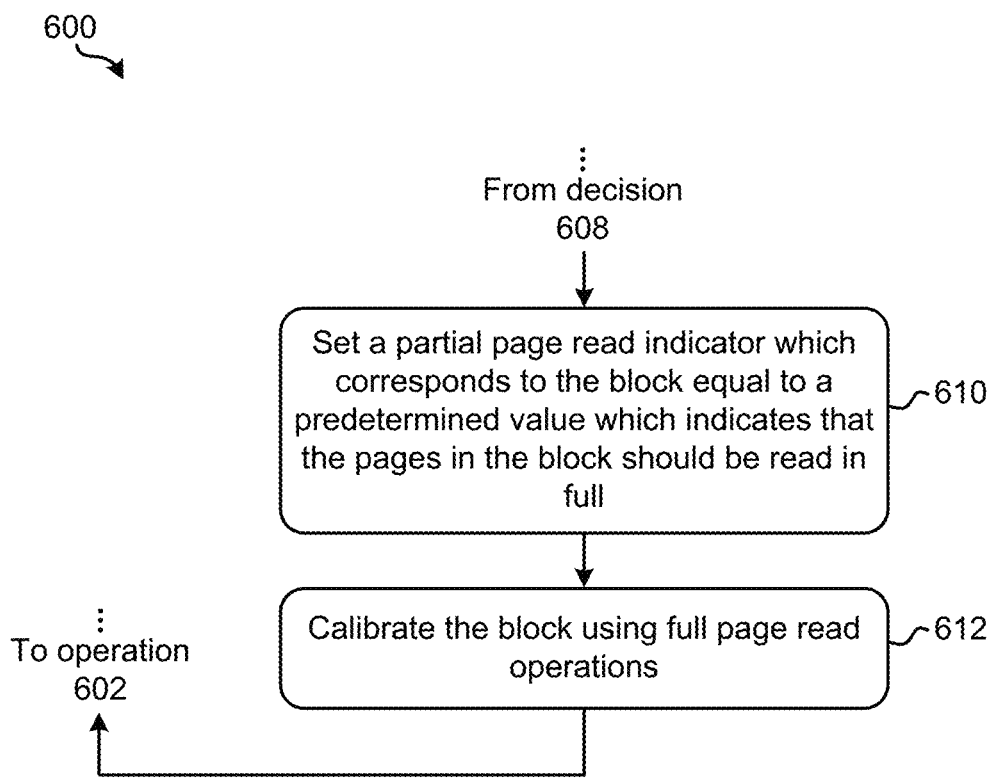

Referring now to FIG. 6A, a flowchart of a method 600 for calibrating read voltages for a block of memory is illustrated in accordance with one approach. The method 600 may be performed in accordance with the present invention in any of the environments depicted in FIGS. 1-5, among others, in various approaches. For instance, any of the processes included in method 600 may be performed with respect to blocks of storage space in NVRAM, e.g., such as 3-D TLC NAND Flash, 3-D QLC NAND Flash, etc., or any other desired type of memory. Furthermore, more or less operations than those specifically described in FIG. 6A may be included in method 600, as would be understood by one of skill in the art upon reading the present descriptions.

Each of the steps of the method 600 may be performed by any suitable component of the operating environment. For example, in various approaches, the method 600 may be partially or entirely performed by a controller (e.g., Flash controller), a processor, a computer, etc., or some other device having one or more processors therein. Thus, in some approaches, method 600 may be a computer-implemented method. It should also be noted that the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6A, operation 602 of method 600 includes advancing to a next block of memory. With respect to the present description, "a next block of memory" may vary depending on the given approach. For instance, upon initiating method 600, a next block of memory may simply be a first block of memory. In other approaches, a next block of memory may be a next logical block of memory. Moreover, operation 602 may progress between the blocks of memory in any desired manner, e.g., sequentially, randomly, using a pattern, etc. Moreover, operation 602 may be triggered periodically, e.g., every 1 week, by a background process that examines all the NAND blocks, or may be triggered on demand, e.g., in the event of a page read in a block exhibiting a high bit error count or an ECC failure. Moreover, the memory preferably includes NVRAM. For instance, in some approaches the memory includes 3-D TLC NAND Flash, while in other approaches the memory includes 3-D QLC NAND Flash.

Decision 604 further includes determining whether the given block of memory should be recalibrated. According to some approaches, criteria may be implemented which identify when and if a particular block should be recalibrated. For example, a block may be recalibrated after experiencing a predetermined number of P/E cycles (e.g., 500 P/E cycles), experiencing an undesirably low performance metric (e.g., the number of bit errors exhibiting a predetermined error count threshold), a predetermined amount of time has passed since a last recalibration, etc. This allows for some reduction in the amount of computing overhead experienced, e.g., as would be appreciated by one skilled in the art after reading the present description.

In response to determining that the given block of memory should not be recalibrated for whatever reason, method 600 returns to operation 602 whereby a next block is advanced to before repeating decision 604. However, in response to determining that the given block of memory should be recalibrated, method 600 proceeds to operation 606. There, operation 606 includes determining a calibration read mode of the block. The calibration read mode of the block is used to determine how the given block should actually be calibrated. For example, the calibration read mode may distinguish whether the given block should be calibrated using full page read operations or partial page read operations. In other words, the calibration read mode essentially provides information which is used to determine whether the block would benefit from a full page read operation as opposed to partial page read operations. While calibrating a block using partial page read operations is significantly more efficient in terms of read latency, implementing a full page read operation periodically is beneficial as it provides calibration information which may be compared against the calibration information collected using the partial page read operations, e.g., as will be described in further detail below.

The calibration read mode of the block is determined in some approaches using one or more available statistics which correspond to the block. For instance, the one or more statistics which may be used to determine the calibration read mode of the block include, but are in no way limited to, a number of P/E cycles the block has experienced, an amount of time since a last full page read operation was performed on the block, a number of read errors experienced by the block, a number of calibration rounds the block has experienced, an amount of retention time the block has experienced, a number of read disturb cycles for the block, etc.

In some approaches the calibration read mode is determined (e.g., calculated) on the fly using the available statistics. However, in other approaches the calibration read mode is updated over time and simply accessed as desired, e.g., from a lookup table.

From operation 606, method 600 proceeds to decision 608 which includes using the calibration read mode to determine whether pages in the block should be read using full page read operations. As mentioned above, while calibrating a block using partial page read operations is significantly more efficient in terms of read latency, implementing a full page read operation periodically is desirable. Doing so provides calibration information which may be compared against the calibration information that is collected over time using the partial page read operations, and therefore acts as a quality check for the calibration of the given block.

In response to determining that pages in the block should be read using full page read operations, method proceeds from decision 608 to operation 610. There, operation 610 includes setting a partial page read indicator which corresponds to the block equal to a predetermined value which indicates that the pages in the block should be read in full. In other words, operation 610 includes indicating that each of the pages in the block being calibrated should be read using full page read operations. Moreover, operation 612 includes actually calibrating the block using full page read operations.

Depending on the approach, the process of actually calibrating the block using full page read operations may be performed differently. For instance, in some approaches operation 612 may actually involve reading each of the pages in the given block, collecting the results of the various read operations (e.g., such as the read error and performance metrics), and analyzing the results to determine an amount by which the various read voltages have shifted. This information may then be used to calculate a read voltage shift value that may then be assigned to each of the respective read voltages such that it is implemented in future read operations that are performed. In other approaches, ECC may be used to correct read errors experienced during the full page read operations.

Figure 6B:
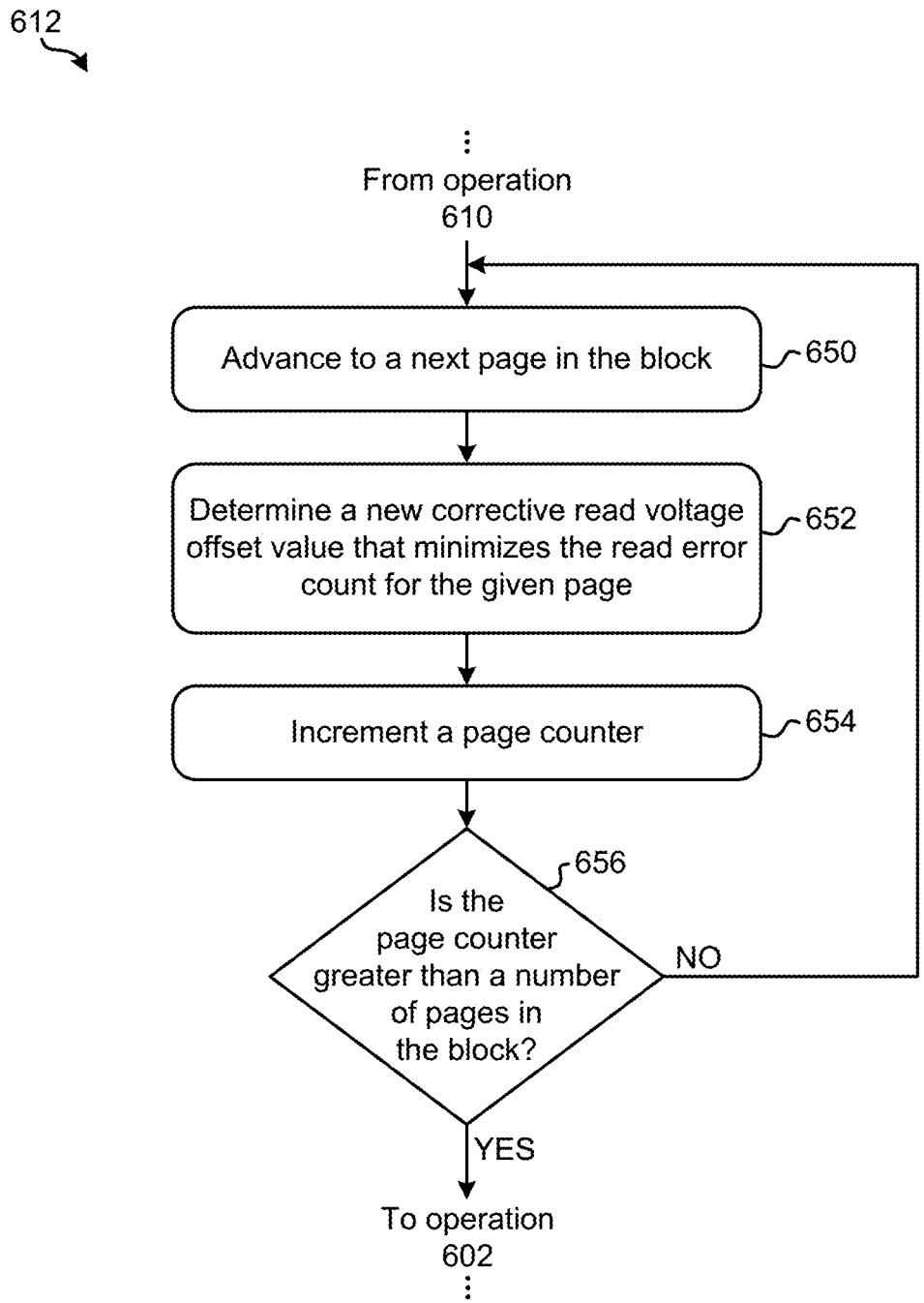
FIG. 6B is a flowchart of sub-processes for one of the operations in the method of FIG. 6A, in accordance with one approach.

Referring momentarily to FIG. 6B, exemplary sub-processes of calibrating the block using full page read operations are illustrated in accordance with one approach, one or more of which may be used to perform operation 612 of FIG. 6A. However, it should be noted that the sub-processes of FIG. 6B are illustrated in accordance with one approach which is in no way intended to limit the invention.

As shown, sub-operation 650 includes advancing to a next page in the block. With respect to the present description, "a next page in the block" may vary depending on the given approach. For instance, upon initiating the flowchart of FIG. 6B, a next page of memory may simply be a first page in the block. In other approaches, a next page may be a next logical page. Moreover, sub-operation 650 may progress between the pages in the block in any desired manner, e.g., sequentially, randomly, using a pattern, etc.

Sub-operation 652 further includes determining a new corrective read voltage offset value that minimizes the read error count for the given page. As mentioned above, this may be achieved by actually reading the given page in full, collecting the results of the full page read operation (e.g., such as the read error and performance metrics), and analyzing the results to determine an amount by which the read voltage has shifted. This information may then be used to calculate a read voltage shift value that minimizes the read error count for the given page. In some approaches, this calibration process may include implementing a level shifting algorithm in order to determine a corrective offset for each voltage, e.g., as would be appreciated by one skilled in the art after reading the present description.

The flowchart further proceeds to sub-operation 654 which includes incrementing a page counter. Moreover, decision 656 includes determining whether the page counter is greater than the number of pages that are included in the block presently being calibrated. In other words, decision 656 determines whether each of the pages in the present block have been calibrated. In response to determining that the page counter is not greater than the number of pages that are included in the block, the flowchart returns to sub-operation 650 such that a next page may be read and calibrated, e.g., as described above. It follows that sub-processes 650-656 may be repeated in an iterative fashion for each page in the given block. However, in response to determining in decision 656 that the page counter is greater than the number of pages that are included in the block, the flowchart determines that the block has been fully calibrated, and returns to operation 602 of FIG. 6A.

Returning now to decision 608 of FIG. 6A, method 600 proceeds to operation 614 in response to determining that pages in the block should not be read using full page read operations. There, operation 614 includes determining a current value of a partial page read indicator for the block. As alluded to above, the partial page read indicator is used to indicate which portion of the pages in a block are to be read during the calibration process. Thus, in situations where only a portion of the block is being read, the partial page read indicator essentially keeps track of which portions of the pages have previously been read. This is desirable as it may be used to ensure that each portion of each page in the block are read as the calibration process advances.

Figure 7A:
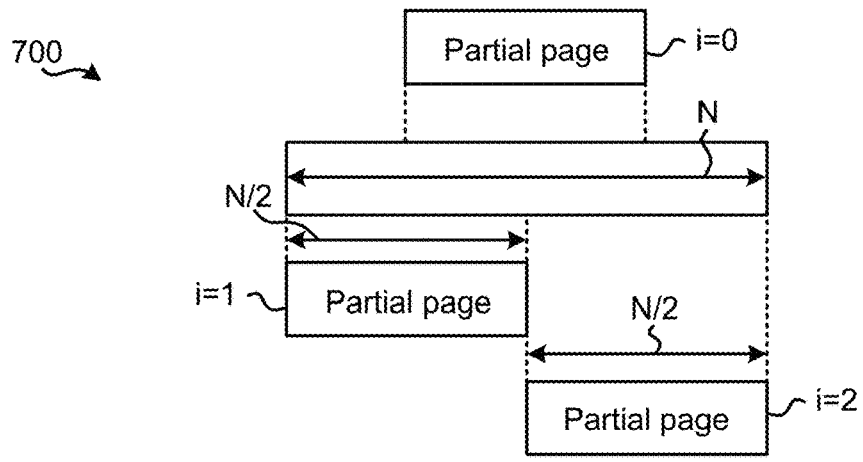
FIG. 7A is partial representational view of a page, in accordance with one approach.

Referring momentarily to FIG. 7A, a representational view of a page 700 and the different partial page read options are illustrated in accordance with one approach. As shown, each portion of the given page which may be read during a partial page read operation amounts to half of the full page. Moreover, the portions of the given page are distinguished from each other by an indicator "i" which may actually be used by the partial page read indicator to identify which portion of the page should be read.

It follows that the partial page read indicator preferably remains updated such that each subsequent calibration round of the same block results in a different portion of the pages being read. The order in which the partial page read indicator is updated may be sequential, random, according to a predetermined pattern, etc., depending on the desired approach.

Returning to FIG. 6A, operation 616 includes calibrating the block by reading only a portion of each page in the block. In other words, each page in the given block is not read completely each time operation 616 is performed. Moreover, as mentioned above, the current value of the partial page read indicator is preferably used to determine which portion of each respective page in the block is read.

Figure 6C:
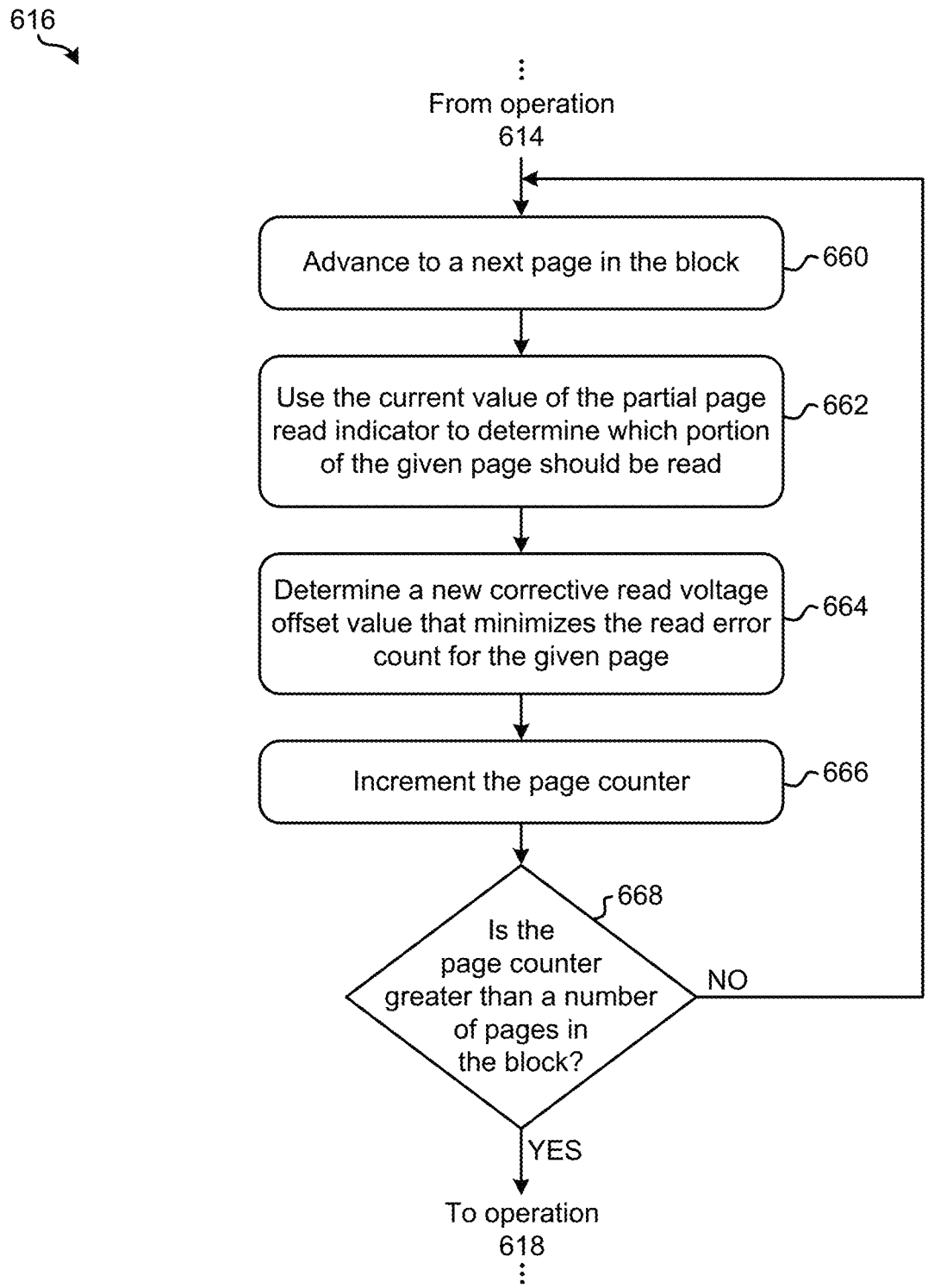
FIG. 6C is a flowchart of sub-processes for one of the operations in the method of FIG. 6A, in accordance with one approach.

Referring momentarily now to FIG. 6C, exemplary sub-processes of calibrating the block using partial page read operations (i.e., calibrating the block by reading only a portion of each page in the block) are illustrated in accordance with one approach. It follows that one or more of the sub-processes included in FIG. 6C may be used to perform operation 616 of FIG. 6A. However, it should be noted that the sub-processes of FIG. 6C are illustrated in accordance with one approach which is in no way intended to limit the invention.

As shown, sub-operation 660 includes advancing to a next page in the block. As mentioned above, "a next page in the block" may vary depending on the given approach. For instance, upon initiating the flowchart of FIG. 6C, a next page of memory may simply be a first page in the block. In other approaches, a next page may be a next logical page. Moreover, sub-operation 660 may progress between the pages in the block in any desired manner, e.g., sequentially, randomly, using a pattern, etc.

Sub-operation 662 further includes using the current value of the partial page read indicator to determine which portion of the given page should be read. Moreover, sub-operation 664 includes determining a new corrective read voltage offset value that minimizes the read error count for the given page. As mentioned above, this is achieved in the present approach by only reading a portion of the given page, collecting the results of the partial page read operation (e.g., such as the read error and performance metrics), and analyzing the results to determine an amount by which the read voltage has shifted based on the portion of the page that was read. This information may then be used to calculate a read voltage shift value that minimizes the read error count for the given page, or at least the portion of the page that was read. In other words, sub-operation 664 includes determining a read voltage shift value which minimizes the page error count using results (e.g., the page read error count) of reading the determined portions of the given pages. In some approaches, this calibration process may include implementing a level shifting algorithm in order to determine a corrective offset for each voltage, e.g., as would be appreciated by one skilled in the art after reading the present description.

While sub-operation 664 involves only reading one portion (e.g., one half) of each full page, the partial page read indicator is updated with each iteration of the present process (e.g., see operation 618 of FIG. 6A). Moreover, the portion of a page that is read as a part of performing sub-operation 664 is dictated in preferred approaches by the current value of the partial page read indicator. Thus, each subsequent time sub-operation 664 is performed on a given block, a different portion of the pages therein are read.

Proceeding to sub-operation 666, here the page counter is incremented. Moreover, decision 668 includes determining whether the page counter is greater than the number of pages that are included in the block presently being calibrated. In other words, decision 668 determines whether each of the pages in the present block have been calibrated. In response to determining that the page counter is not greater than the number of pages that are included in the block, the flowchart returns to sub-operation 660 such that a next page may be read and calibrated, e.g., as described above. It follows that sub-processes 660-668 may be repeated in an iterative fashion for each page in the given block. However, in response to determining in decision 668 that the page counter is greater than the number of pages that are included in the block, the flowchart determines that the block has been fully calibrated, and proceeds to operation 618 of FIG. 6A.

Returning again to FIG. 6A, operation 618 includes incrementing the current value of the partial page read indicator before returning to operation 602. In other words, the partial page read indicator is updated so that each subsequent calibration round of the same block, i.e., the next time the block will be examined for recalibration, a different portion of the pages therein are read, e.g., as mentioned above.

It follows that FIGS. 6A-6C are able to significantly decrease the amount of latency that is experienced as a result of reading and calibrating blocks of memory, e.g., particularly in comparison to the performance issues that have been experienced by conventional calibration procedures. In preferred approaches, these improvements are achieved by performing calibration procedures which implement partial page read operations that reduce the overall latency of the calibration algorithm. These improvements are achieved by implementing the calibration procedures described herein which benefit from the reduced latency of partial page reads without compromising the accuracy of the calibration algorithm.

Figure 6D:
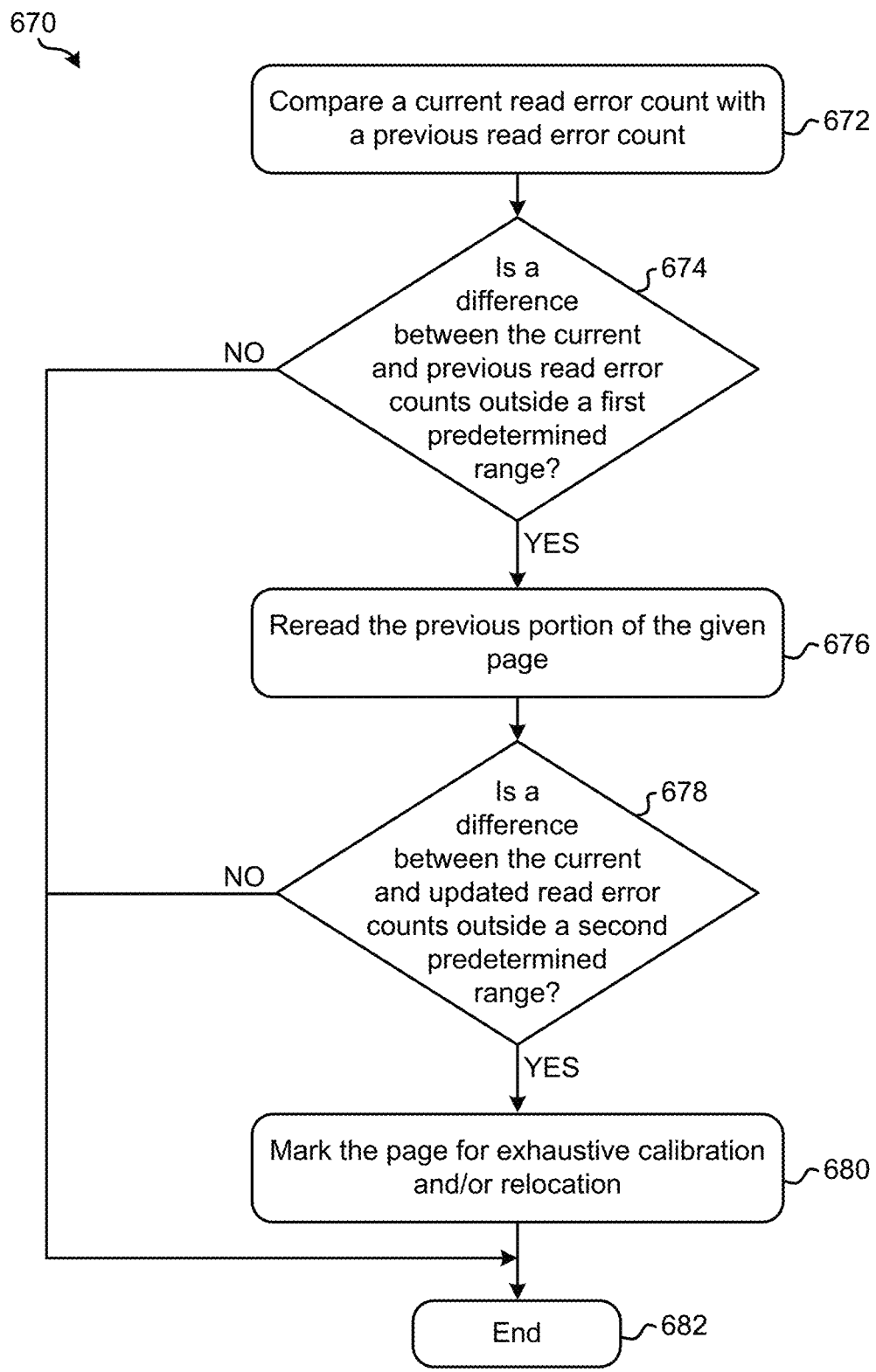
FIG. 6D is a flowchart of a method, in accordance with one approach.

Moreover, in order to preserve the robustness of the calibration algorithm, an abnormal error detection scheme is implemented in some approaches in order to monitor the error differences between the partial page readouts. For example, FIG. 6D illustrates a method 670 for detecting abnormal behavior for a given page, in accordance with one approach. The method 670 may be performed in accordance with the present invention in any of the environments depicted in FIGS. 1-6C, among others, in various approaches. For example, any of the processes included in method 670 may be implemented during the process of calibrating a given block using full page read operations and/or partial page read operations. It follows that method 670 may optionally be performed in the background of a running block calibration procedure in order to identify abnormally performing pages and/or blocks of memory.

Furthermore, more or less operations than those specifically described in FIG. 6D may be included in method 670, as would be understood by one of skill in the art upon reading the present descriptions. Each of the steps of the method 670 may be performed by any suitable component of the operating environment. For example, in various approaches, the method 670 may be partially or entirely performed by a controller (e.g., Flash controller), a processor, a computer, etc., or some other device having one or more processors therein. Thus, in some approaches, method 670 may be a computer-implemented method. It should also be noted that the terms computer, processor and controller may be used interchangeably with regards to any of the approaches herein, such components being considered equivalents in the many various permutations of the present invention.

Moreover, for those approaches having a processor, the processor, e.g., processing circuit(s), chip(s), and/or module(s) implemented in hardware and/or software, and preferably having at least one hardware component may be utilized in any device to perform one or more steps of the method 670. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6D, operation 672 of method 670 includes comparing a current read error count with a previous read error count. In other words, operation 672 includes comparing a read error count experienced as a result of performing the current (latest) full or partial page read operation with the read error count experienced as a result of performing the previous full or partial page read operation. The previous read error count may be stored in the system (e.g., in memory) and therefore may be accessed from a respective storage location. The previous full or partial page read operation may be inferred from the current value of the partial page read indicator. Moreover, in some approaches only an absolute value of the error count may be used.

Decision 674 includes determining whether a difference between the current read error count for the determined portion of the given page and the previous read error count for the previous portion of the given page is outside a first predetermined range. In other words, decision 674 includes determining whether the difference between the current read error count and the previous read error count is undesirably high. However, in other approaches a function may be applied to the current and previous error counts. The function may involve applying a weighted difference, where the weights may be determined based on the state of the given block, e.g., based on P/E cycles, retention, read-disturb rates, etc.

In response to determining that the difference therebetween is undesirably high, method 670 proceeds to operation 676 which includes rereading the previous portion of the given page. Since the previous read error count associated with reading the previous portion of the given page was obtained in the previous calibration round, the reread of the previous portion in operation 676 is performed using the most current read offset values, i.e., the read offset values used to obtain the current read error count. Determining that the difference therebetween is undesirably high indicates that a undesirably large difference in error or performance has been observed for different portions of the same page. Therefore, the previously read portion of the page is preferably reread in order to compensate for any errors that may have occurred in the reading process.

From operation 676, method 670 proceeds to decision 678 which includes determining whether a difference between the current read error count for the determined portion of the given page and an updated read error count for the previous portion of the given page is outside a second predetermined range. The second predetermined range may be more or less confined depending on the approach. For instance, tolerances may be increased in response to performing the second comparison in some approaches. Other approaches may involve decreasing tolerances during the second comparison, e.g., to ensure the difference in performance is minimal.

In response to determining that the difference between the current read error count and the updated read error count is outside the second predetermined range, operation 680 further includes marking the page for exhaustive calibration and/or relocation. However, in some approaches the entire block is marked for exhaustive calibration and/or relocation. With respect to the present description, "exhaustive calibration" may include any desired additional calibration procedure which is preferably able to improve the calibration of the given page and/or block as a whole, e.g., by adjusting the read voltages by applying read offset values that are optimal for the given state of the block such that the page read error count is minimized. It should also be noted that in situations where the entire block is marked for relocation, the ongoing calibration of the block is terminated without calibrating the remaining pages therein.

From operation 680, the flowchart of FIG. 6D proceeds to operation 682, whereby method 670 may end. Moreover, looking back to decisions 674 and 678, method 670 jumps to operation 682 in response to determining that the differences are not outside the respective predetermined ranges.

However, it should be noted that although method 670 may end upon reaching operation 682, any one or more of the processes included in method 670 may be repeated in order to detecting abnormal behavior for additional pages and/or blocks. According to other approaches, method 670 may proceed to any one of the processes included in method 600 in response to determining that the differences are not outside the respective predetermined ranges. For instance, method 670 may be performed prior to determining the read voltage shift value for a given page, whereby operation 682 includes returning to operation 616 or 612 such that the read voltage shift values may be determined using the results of reading the full page or portion thereof, respectively.

It should also be noted that "outside a range" is in no way intended to limit the invention. Rather than determining whether a value is outside a range, equivalent determinations may be made, e.g., as to whether a value is above a threshold, whether a value is outside a predetermined range, whether an absolute value is above a threshold, whether a value is below a threshold, etc., depending on the desired approach. Moreover, any of the predetermined ranges described herein may be predetermined by a user, system settings, current performance metrics, etc. In other approaches, the thresholds may be determined based on the state of the given block, which again may be determined based on P/E cycles, retention, read-disturb rates, etc.

Figure 7B:
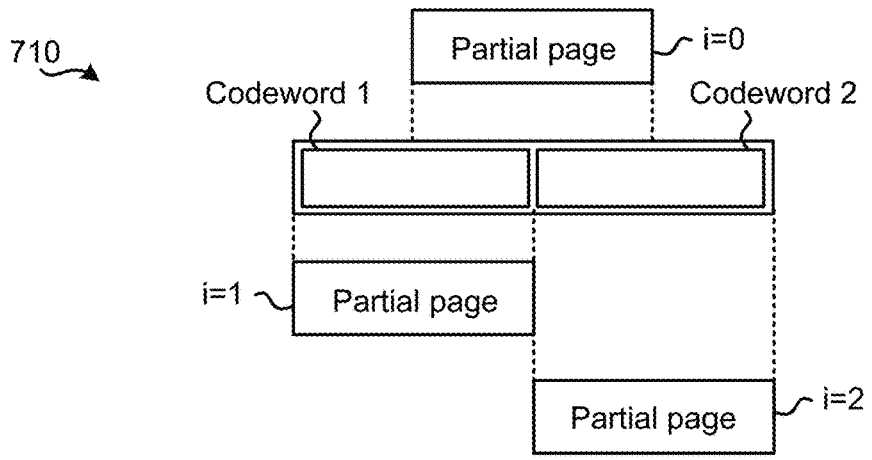
FIG. 7B is partial representational view of a page, in accordance with one approach.
Figure 7C:
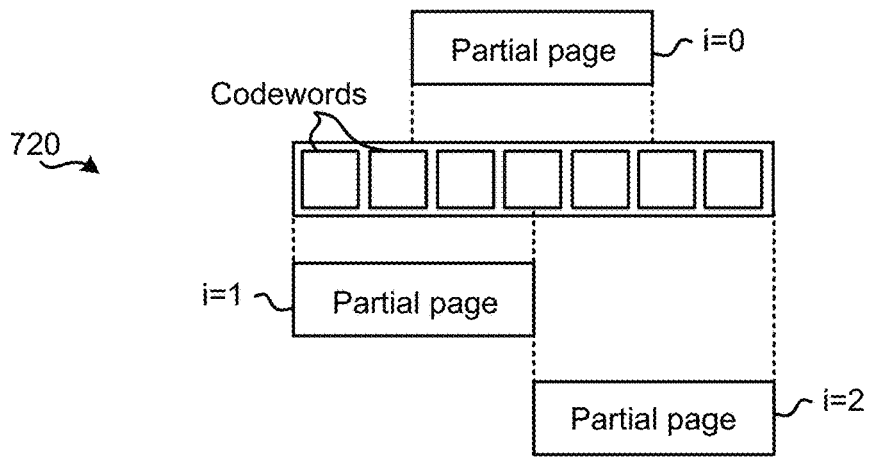
FIG. 7C is partial representational view of a page, in accordance with one approach.

Looking now to FIG. 7A, as mentioned above, a representational view of a page 700 and the different partial page read options are illustrated in accordance with one approach. As shown, each portion N/2 of the given page which may be read during a partial page read operation amounts to half of the full page N. Moreover, the portions of the given page are distinguished from each other by an indicator "i" which may actually be used by the partial page read indicator to identify which portion of the page should be read. FIGS. 7B-7C further include more detailed views of different codeword configurations for different pages 710, 720, respectively.

Looking first to FIG. 7B, the page 710 is illustrated as including two larger codewords. Moreover, the codewords are sized and positioned such that the left partial page read L corresponds to codeword 1, while the right partial page read R corresponds to codeword 2. Furthermore, the center partial page read C overlaps a portion of both codewords in the page 710. Moreover, each partial page read operation corresponds to half of the entire page 710. It follows that each partial page read operation reads a different portion of the given page 710, but together, the right, center and left partial page read operations are able to read the entire page 710. This allows for a number of partial read operations to collectively read the entire page 710.

Partial page reads are realized by using special partial read commands that aim to read only the desired portion of the page (and not the entire page) and thus have reduced read latency in comparison to performing a full read operation. In other words, when using a partial page read command, the memory controller can read only the data from the corresponding portion of the page and not any other portion. However, when the health of a page is determined, e.g., by examining the read error count during calibration, it is desirable that the error count across all bits in the given page is evaluated. In order to use partial page reads during calibration without compromising the effectiveness of the calibration algorithm due to the partial page error count information, it is desirable to use partial page reads of different portions during successive calibration rounds. Furthermore, it is desirable to correlate the information of the different portions of the given page in order to identify inconsistencies among the different portions.

While the page 720 shown in FIG. 7C includes a greater number of codewords therein, the same general principle applies. Again, each of the right, center and left partial page read operations are able to read one half of the entire page 720, but together, the partial page read operations are able to collectively read the entire page 720. Although FIGS. 7A-7C illustrate examples of partial page reads of size equal to one half of the page size, other options may be implemented by the memory manufacturers, e.g., a partial page read may correspond to a portion of size equal to one quarter of the page size.

Figure 8A:
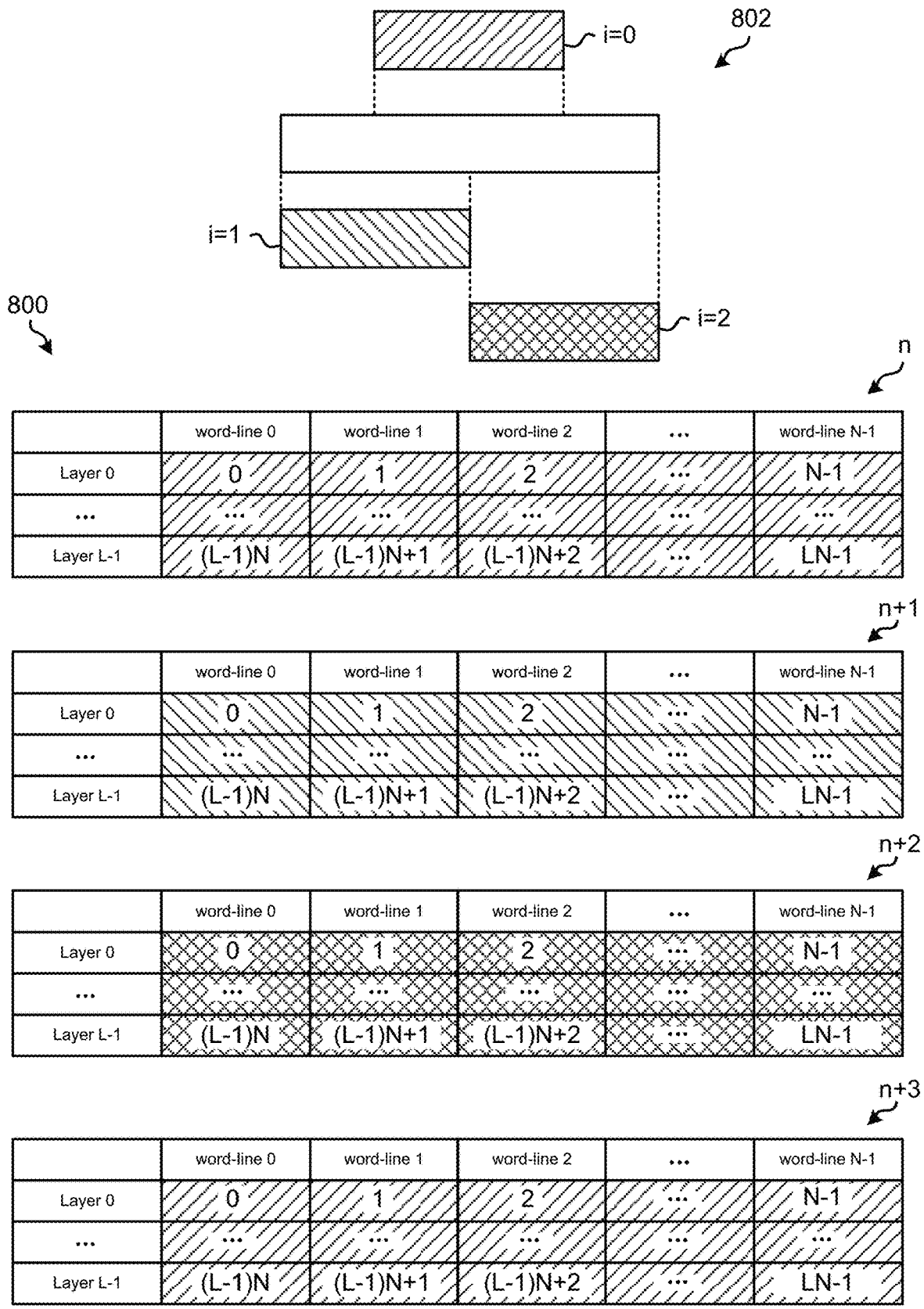
FIG. 8A is a representational view of an illustrative in-use example.
Figure 8B:
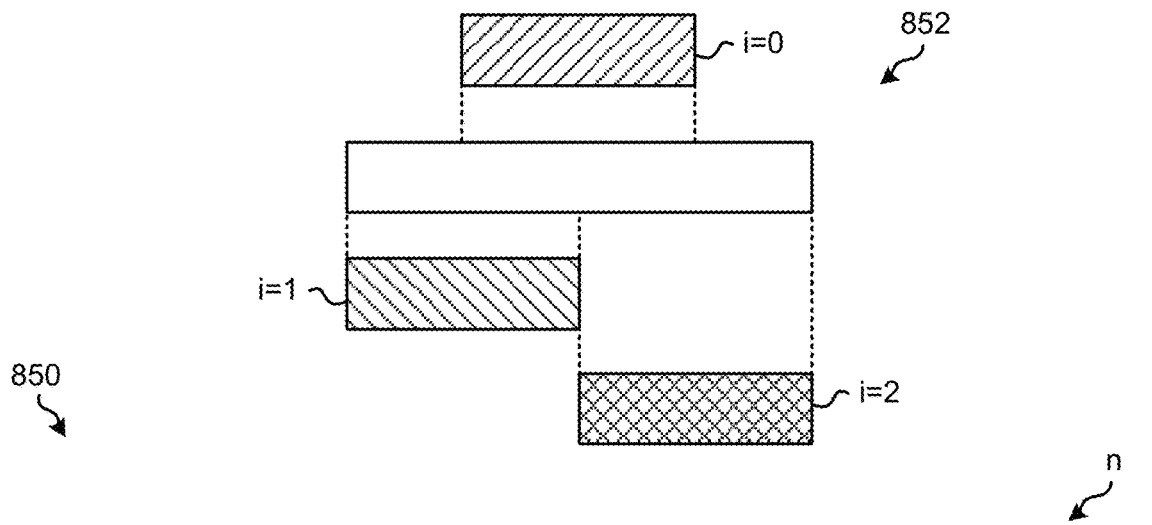
FIG. 8B is a representational view of an illustrative in-use example.

Referring now to FIGS. 8A-8B, two in-use examples 800, 850 which depict two different ways that the partial page read operations may advance through the different portions of pages in a given block that is being calibrated. Either of these in-use examples 800, 850 (or others) may be implemented in any of the approaches included herein, but are in no way intended to be limiting, e.g., as would be appreciated by one skilled in the art after reading the present description.

Looking first to FIG. 8A, the in-use example 800 includes a number of tables, each of which correspond to a different calibration round which are indicated by n, n+1, n+2, n+3, etc. The different forms of crosshatching included in each of the tables are intended to correspond to the different portions i=0, i=1, i=2 of the illustrative page 802 being read using partial page read operations.

Looking specifically to the table which corresponds to calibration round n, each of the crosshatched table entries correspond to different pages on the various layers (Layer 0 through Layer L-1) and word-lines (word-line 0 through word-line N-1) in the given block being calibrated. Moreover, because the crosshatching of the various pages in the table which corresponds to calibration round n match the crosshatching of the i=0 page portion, the center portion of each page in the block being calibrated is read first.

Proceeding to the table which corresponds to calibration round n+1, because the crosshatching of the various pages in the table match the crosshatching of the i=1 page portion, the left portion of each page in the block being calibrated is read next. Subsequently, the table which corresponds to calibration round n+2 includes crosshatching which matches the crosshatching of the i=2 page portion, thereby indicating that the right portion of each page in the block being calibrated is read next.

Proceeding to the table which corresponds to calibration round n+3, the crosshatching of the various pages in the table match the crosshatching of the i=0 page portion again. This indicates that the calibration process has returned to read the center portion of each page in the block again. Thus, the partial page read operations may advance through the different portions of the pages in a round-robin manner any desired number of times.

Referring now to FIG. 8B, the in-use example 850 also includes a number of tables, each of which correspond to a different calibration round which are indicated by n, n+1, etc. The different forms of crosshatching included in each of the pages in each of the tables are intended to correspond to the different portions i=0, i=1, i=2 of the illustrative page 852 being read using partial page read operations.

While the in-use example illustrated in FIG. 8A includes reading the same portion of every page in the block for each of the calibration rounds, the in-use example 850 illustrated in FIG. 8B employs a rotating approach. For instance, looking specifically to the table which corresponds to calibration round n, each of the crosshatched table entries correspond to a different one of the page portions. Specifically, the crosshatching for the pages in Layer 0 and word-line 0 matches that of the i=0 page portion, thereby indicating that the center portion of those specific pages is read, e.g., in case of a QLC NAND block, all four pages (lower, upper, extra, top pages) corresponding to Layer 0 and word-line 0 are read based on indicator i=0 at calibration round n. However, the adjacent pages in Layer 0 and word-line 1 have crosshatching which matches that of the i=1 page portion, thereby indicating that the left portion of those specific pages is read, and so on.

Moreover, looking to the table which corresponds to calibration round n+1, the crosshatching has changed such that the left portion of the pages in Layer 0 and word-line 0 is read, while the right portion of the pages in Layer 0 and word-line 1 is read. It follows that the partial page read operations advance in a similar round-robin manner any desired number of times, preferably such that each portion of each page is read at least once.

Again, various ones of the approaches included herein are able to significantly decrease the amount of latency that is experienced as a result of reading and calibrating blocks of memory, e.g., particularly in comparison to the performance issues that have been experienced by conventional calibration procedures. In preferred approaches, these improvements are achieved by performing calibration procedures which implement partial page read operations that reduce the overall latency of the calibration algorithm. These improvements are achieved by implementing the calibration procedures described herein which benefit from the reduced latency of partial page reads without compromising the accuracy of the calibration algorithm.

As noted above, each calibration round involves reading a different portion of the pages in a block being calibrated such that the entire page is read in a given number of successive calibration rounds. Furthermore, the same or different portions of each page in a block may be read during a given calibration round. It is desired that a current value of the partial page read indicator is updated such that a different portion of the pages is read in the subsequent calibration rounds. Moreover, the method may periodically perform calibration rounds using full page read operations on a given block and further correlate the errors of the full page read operations and partial page read operations to detect an abnormal error behavior.

It should also be noted that none of the particular configurations included in any of the approaches included herein are intended to be limiting. For instance, the number and/or type of pages included in a given word-line and/or block of memory, the number and/or values of the read voltages, the number and/or values of the threshold voltage levels, etc., included in any of the approaches herein are in no way intended to be limiting, but rather have been presented by way of example only.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

Figure 9:
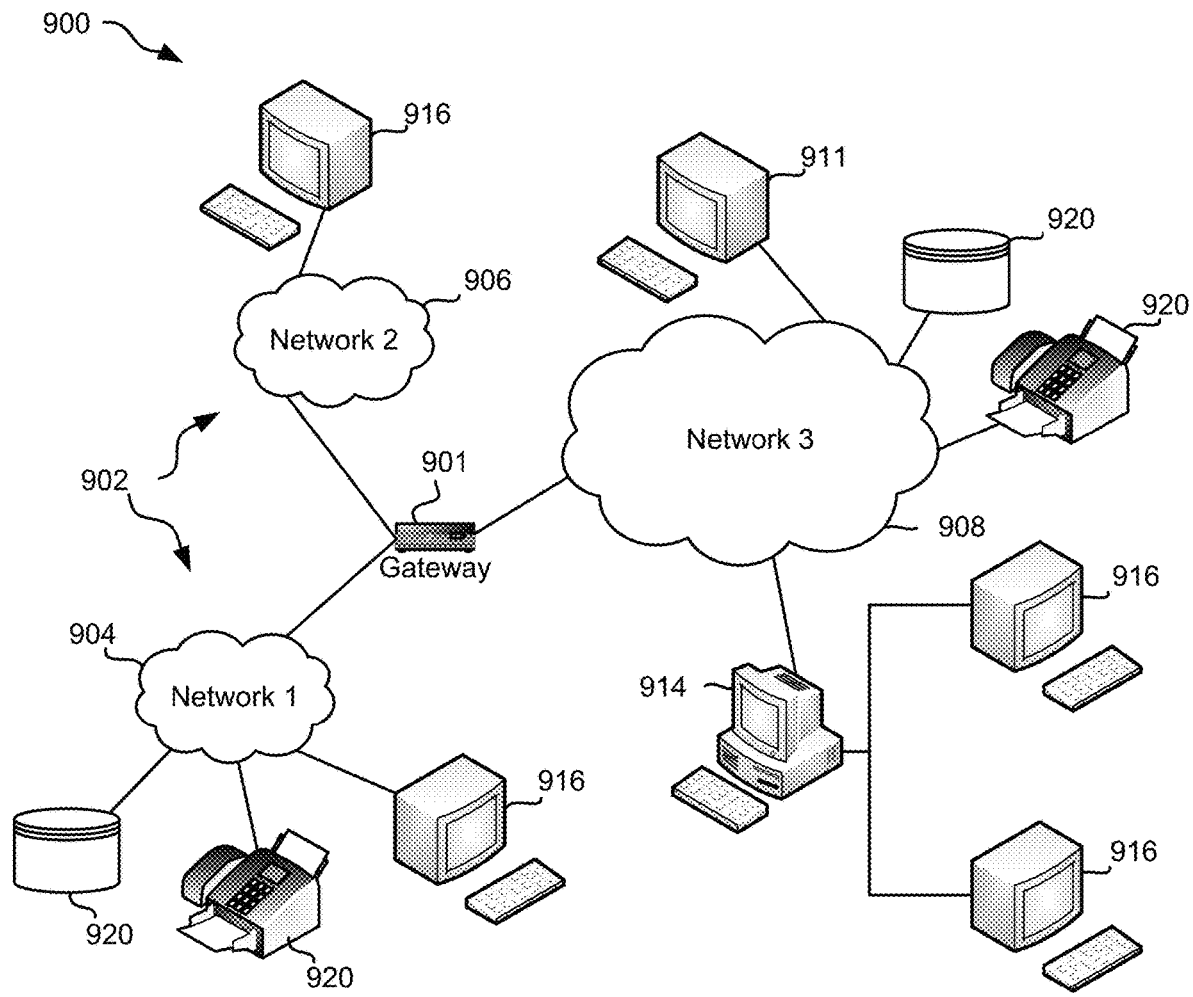
FIG. 9 is a network architecture, in accordance with one approach.

FIG. 9 illustrates a network architecture 900, in accordance with one approach. As shown in FIG. 9, a plurality of remote networks 902 are provided including a first remote network 904 and a second remote network 906. A gateway 901 may be coupled between the remote networks 902 and a proximate network 908. In the context of the present network architecture 900, the networks 904, 906 may each take any form including, but not limited to a LAN, a WAN such as the Internet, public switched telephone network (PSTN), internal telephone network, etc.

In use, the gateway 901 serves as an entrance point from the remote networks 902 to the proximate network 908. As such, the gateway 901 may function as a router, which is capable of directing a given packet of data that arrives at the gateway 901, and a switch, which furnishes the actual path in and out of the gateway 901 for a given packet.

Further included is at least one data server 914 coupled to the proximate network 908, and which is accessible from the remote networks 902 via the gateway 901. It should be noted that the data server(s) 914 may include any type of computing device/groupware. Coupled to each data server 914 is a plurality of user devices 916. Such user devices 916 may include a desktop computer, laptop computer, handheld computer, printer, and/or any other type of logic-containing device. It should be noted that a user device 911 may also be directly coupled to any of the networks, in some approaches.

A peripheral 920 or series of peripherals 920, e.g., facsimile machines, printers, scanners, hard disk drives, networked and/or local data storage units or systems, etc., may be coupled to one or more of the networks 904, 906, 908. It should be noted that databases and/or additional components may be utilized with, or integrated into, any type of network element coupled to the networks 904, 906, 908. In the context of the present description, a network element may refer to any component of a network.

According to some approaches, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some approaches.

In other approaches, one or more networks 904, 906, 908, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 10:
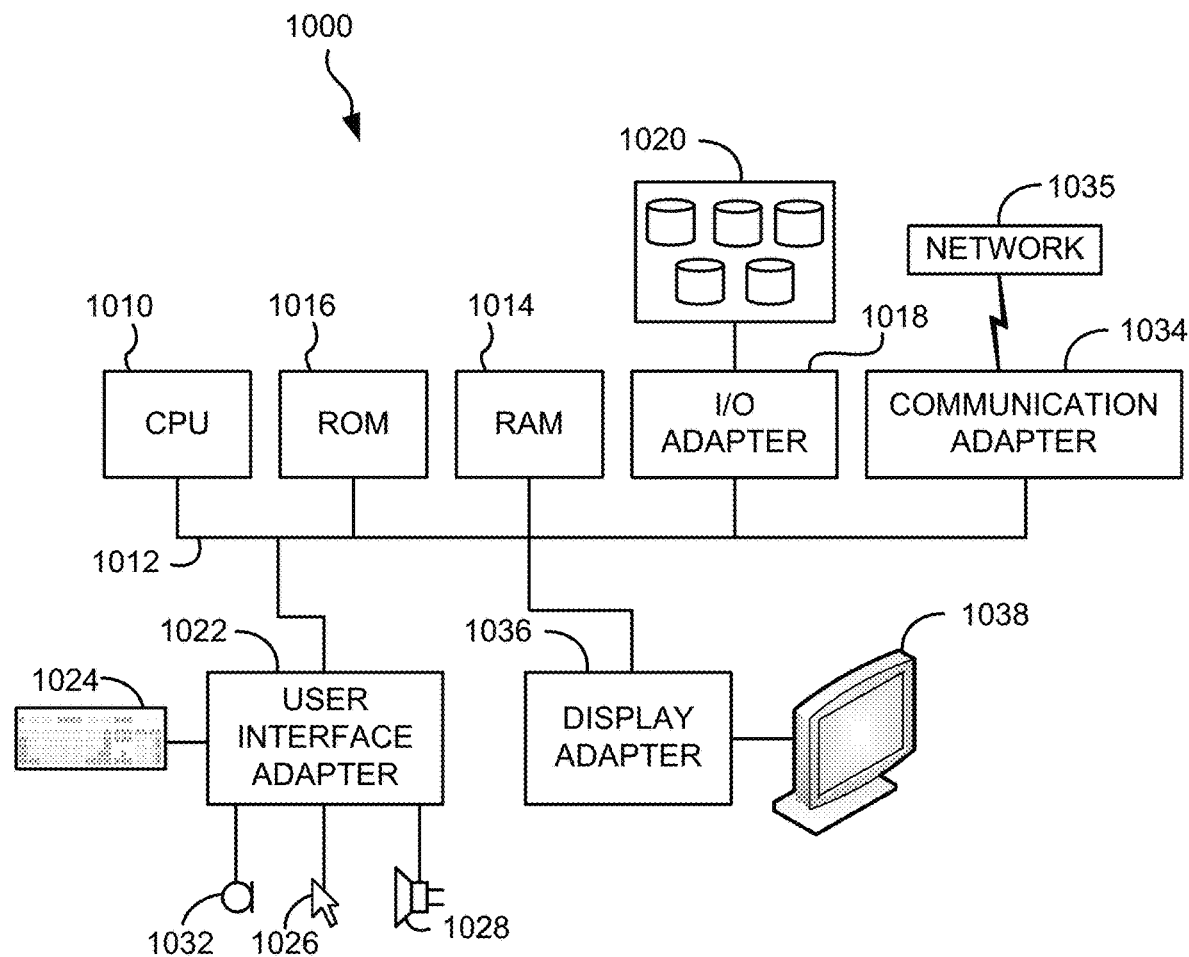
FIG. 10 is a representative hardware environment that may be associated with the servers and/or clients of FIG. 9, in accordance with one approach.

FIG. 10 shows a representative hardware environment associated with a user device 916 and/or server 914 of FIG. 9, in accordance with one approach. FIG. 10 illustrates a typical hardware configuration of a processor system 1000 having a central processing unit 1010, such as a microprocessor, and a number of other units interconnected via a system bus 1012, according to one approach. In some approaches, central processing unit 1010 may include any of the approaches described above with reference to the one or more processors 210 of FIG. 2.

The processor system 1000 shown in FIG. 10 includes a RAM 1014, Read Only Memory (ROM) 1016, and an I/O adapter 1018. According to some approaches, which are in no way intended to limit the invention, I/O adapter 1018 may include any of the approaches described above with reference to I/O adapter 218 of FIG. 2. Referring still to processor system 1000 of FIG. 10, the aforementioned components 1014, 1016, 1018 may be used for connecting peripheral devices such as storage subsystem 1020 to the bus 1012. In some approaches, storage subsystem 1020 may include a similar and/or the same configuration as data storage system 220 of FIG. 2. According to an example, which is in no way intended to limit the invention, storage subsystem 1020 may include non-volatile data storage cards, e.g., having NVRAM memory cards, RAM, ROM, and/or some other known type of non-volatile memory, in addition to RAID controllers as illustrated in FIG. 2.

With continued reference to FIG. 10, a user interface adapter 1022 for connecting a keyboard 1024, a mouse 1026, a speaker 1028, a microphone 1032, and/or other user interface devices such as a touch screen, a digital camera (not shown), etc., to the bus 1012.

Processor system 1000 further includes a communication adapter 1034 which connects the processor system 1000 to a communication network 1035 (e.g., a data processing network) and a display adapter 1036 which connects the bus 1012 to a display device 1038.

The processor system 1000 may have resident thereon an operating system such as the MICROSOFT WINDOWS Operating System (OS), a MAC OS, a UNIX OS, etc. It will be appreciated that a preferred approach may also be implemented on platforms and operating systems other than those mentioned. A preferred approach may be written using JAVA, XML, C, and/or C++ language, or other programming languages, along with an object oriented programming methodology. Object oriented programming (OOP), which has become increasingly used to develop complex applications, may be used.

Figure 11:
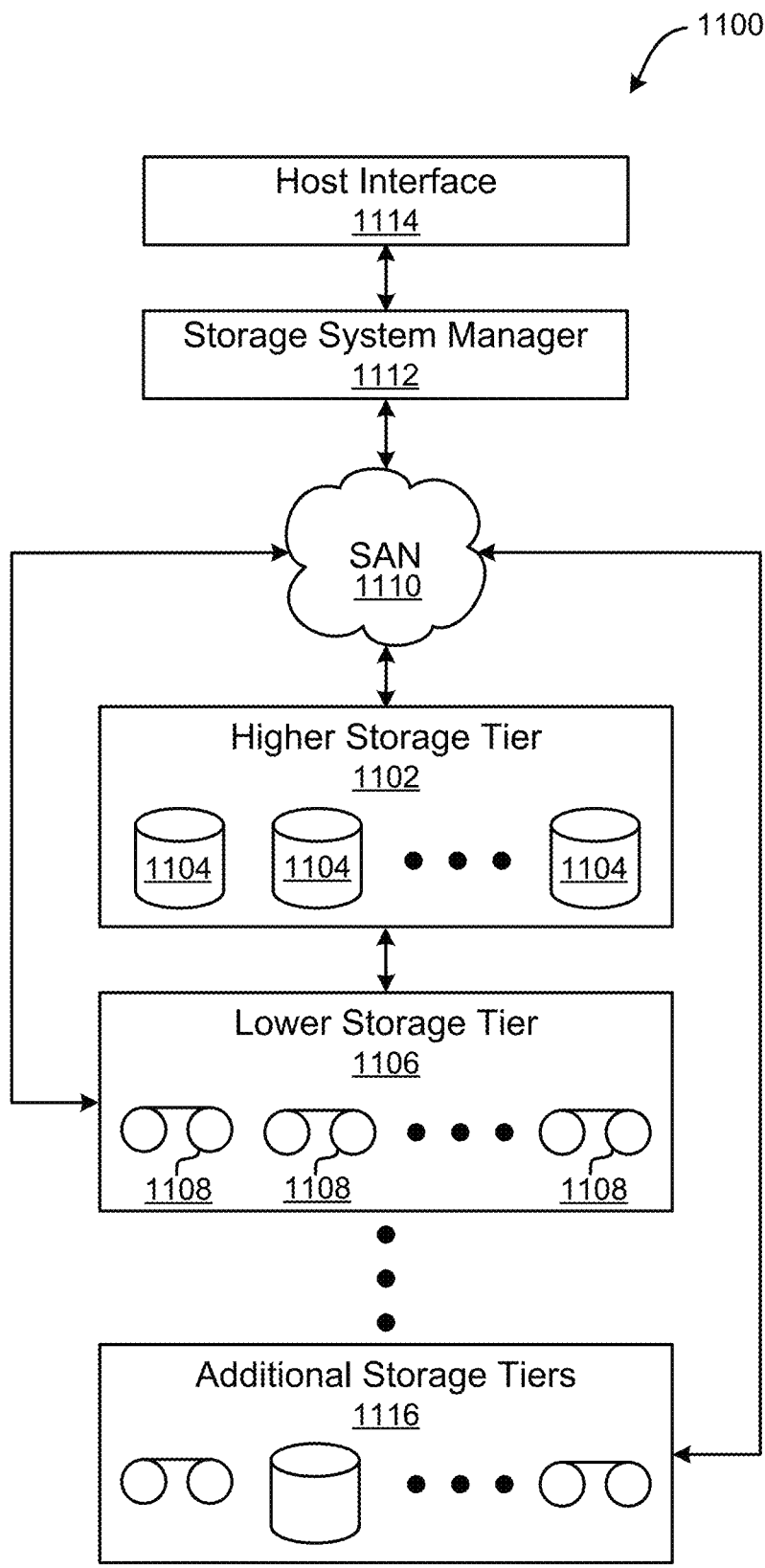
FIG. 11 is a tiered data storage system in accordance with one approach.

Moreover, FIG. 11 illustrates a storage system 1100 which implements high level (e.g., SSD) storage tiers in combination with lower level (e.g., magnetic tape) storage tiers, according to one approach. Note that some of the elements shown in FIG. 11 may be implemented as hardware and/or software, according to various approaches. The storage system 1100 may include a storage system manager 1112 for communicating with a plurality of media on at least one higher storage tier 1102 and at least one lower storage tier 1106. However, in other approaches, a storage system manager 1112 may communicate with a plurality of media on at least one higher storage tier 1102, but no lower storage tier. The higher storage tier(s) 1102 preferably may include one or more random access and/or direct access media 1104, such as hard disks, nonvolatile memory (NVM), NVRAM), solid state memory in SSDs, Flash memory, SSD arrays, Flash memory arrays, etc., and/or others noted herein or known in the art. According to illustrative examples, FIGS. 3-4 show exemplary architectures of SSD systems which may be used as a higher storage tier 1102 depending on the desired approach.

Referring still to FIG. 11, the lower storage tier(s) 1106 preferably includes one or more lower performing storage media 1108, including sequential access media such as magnetic tape in tape drives and/or optical media, slower accessing HDDs, slower accessing SSDs, etc., and/or others noted herein or known in the art. One or more additional storage tiers 1116 may include any combination of storage memory media as desired by a designer of the system 1100. Thus, the one or more additional storage tiers 1116 may, in some approaches, include a SSD system architecture similar or the same as those illustrated in FIGS. 1-2. Also, any of the higher storage tiers 1102 and/or the lower storage tiers 1106 may include any combination of storage devices and/or storage media.

The storage system manager 1112 may communicate with the storage media 1104, 1108 on the higher storage tier(s) 1102 and lower storage tier(s) 1106 through a network 1110, such as a storage area network (SAN), as shown in FIG. 11, or some other suitable network type. The storage system manager 1112 may also communicate with one or more host systems (not shown) through a host interface 1114, which may or may not be a part of the storage system manager 1112. The storage system manager 1112 and/or any other component of the storage system 1100 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more approaches, the storage system 1100 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1102, may include a majority of SSD storage media for storing data in a higher performing storage environment, and remaining storage tiers, including lower storage tier 1106 and additional storage tiers 1116 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1102, while data not having one of these attributes may be stored to the additional storage tiers 1116, including lower storage tier 1106. Of course, one of skill in the art, upon reading the present descriptions, may devise many other combinations of storage media types to implement into different storage schemes, according to the approaches presented herein.

According to some approaches, the storage system (such as 1100) may include logic configured to receive a request to open a data set, logic configured to determine if the requested data set is stored to a lower storage tier 1106 of a tiered data storage system 1100 in multiple associated portions, logic configured to move each associated portion of the requested data set to a higher storage tier 1102 of the tiered data storage system 1100, and logic configured to assemble the requested data set on the higher storage tier 1102 of the tiered data storage system 1100 from the associated portions.

Of course, this logic may be implemented as a method on any device and/or system or as a computer program product, according to various embodiments.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for calibrating read voltages for a block of memory, comprising:
   determining a calibration read mode of the block;
   using the calibration read mode to determine whether pages in the block should be read using full page read operations;
   in response to determining that the pages in the block should not be read using full page read operations, determining a current value of a partial page read indicator for the block;
   calibrating the block by reading only a portion of each page in the block, wherein the current value of the partial page read indicator determines which portion of each respective page in the block is read; and
   incrementing the current value of the partial page read indicator.

2. The computer-implemented method of claim 1, wherein calibrating the block by reading only a portion of each page in the block includes, for each page in the block:
   using the current value of the partial page read indicator to determine which portion of the given page should be read;
   reading the determined portion of the given page; and
   determining a read voltage shift value using results of reading the determined portion of the given page.

3. The computer-implemented method of claim 2, wherein the determined portion of the given page is half of the full page.

4. The computer-implemented method of claim 2, comprising:
   determining whether a difference between a current read error count for the determined portion of the given page and a previous read error count for a previous portion of the given page is outside a predetermined range;
   in response to determining that the difference between the current read error count and the previous read error count is outside the predetermined range, rereading the previous portion of the given page;
   determining whether a difference between the current read error count for the determined portion of the given page and an updated read error count for the previous portion of the given page is outside a second predetermined range; and
   in response to determining that the difference between the current read error count and the updated read error count is outside the second predetermined range, marking the page for exhaustive calibration and/or relocation.

5. The computer-implemented method of claim 4, comprising:
   in response to determining that the difference between the current read error count for the given page and the previous read error count for the given page is not outside the predetermined range, determining the read voltage shift value using the results of reading the determined portion of the given page.

6. The computer-implemented method of claim 1, wherein the calibration read mode is determined using one or more statistics which correspond to the block, wherein the one or more statistics used to determine the calibration read mode of the block are selected from the group consisting of: a number of calibration rounds, a number of P/E cycles, a retention time, and a number of read disturb cycles.

7. The computer-implemented method of claim 1, wherein the memory is non-volatile random access memory (NVRAM).

8. The computer-implemented method of claim 7, wherein the NVRAM includes three-dimensional triple-level-cell NAND Flash.

9. The computer-implemented method of claim 7, wherein the NVRAM includes three-dimensional quad-level-cell NAND Flash.

10. A computer program product for calibrating read voltages for a block of memory, the computer program product comprising a computer readable storage medium having program instructions embodied therewith, the program instructions readable and/or executable by a processor to cause the processor to:
    determine, by the processor, a calibration read mode of the block;
    use, by the processor, the calibration read mode to determine whether pages in the block should be read using full page read operations;
    in response to determining that the pages in the block should not be read using full page read operations, determine, by the processor, a current value of a partial page read indicator for the block;
    calibrate, by the processor, the block by reading only a portion of each page in the block, wherein calibrating the block includes using the current value of the partial page read indicator to determine which portion of the given page should be read, wherein the determined portion of the given page is half of the given page; and
    increment, by the processor, the current value of the partial page read indicator.

11. The computer program product of claim 10, wherein calibrating the block by reading only a portion of each page in the block includes, for each page in the block:
    reading the determined portion of the given page; and
    determining a read voltage shift value using results of reading the determined portion of the given page,
    wherein the current value of the partial page read indicator determines which portion of each respective page in the block is read.

12. The computer program product of claim 11, wherein the program instructions are readable and/or executable by the processor to cause the processor to:
    determine, by the processor, whether a difference between a current read error count for the determined portion of the given page and a previous read error count for a previous portion of the given page is outside a predetermined range;
    in response to determining that the difference between the current read error count and the previous read error count is outside the predetermined range, reread, by the processor, the previous portion of the given page;
    determine, by the processor, whether a difference between the current read error count for the determined portion of the given page and an updated read error count for the previous portion of the given page is outside a second predetermined range; and
    in response to determining that the difference between the current read error count and the updated read error count is outside the second predetermined range, mark, by the processor, the page for exhaustive calibration and/or relocation.

13. The computer program product of claim 12, wherein the program instructions are readable and/or executable by the processor to cause the processor to:
    in response to determining that the difference between the current read error count for the given page and the previous read error count for the given page is not outside the predetermined range, determine, by the processor, the read voltage shift value using the results of reading the determined portion of the given page.

14. The computer program product of claim 10, wherein the calibration read mode is determined using one or more statistics which correspond to the block, wherein the one or more statistics used to determine the calibration read mode of the block are selected from the group consisting of: a number of calibration rounds, a number of P/E cycles, a retention time, and a number of read disturb cycles.

15. The computer program product of claim 10, wherein the memory is non-volatile random access memory (NVRAM).

16. The computer program product of claim 15, wherein the NVRAM includes three-dimensional triple-level-cell NAND Flash.

17. The computer program product of claim 15, wherein the NVRAM includes three-dimensional quad-level-cell NAND Flash.

18. A system, comprising:
a plurality of non-volatile random access memory (NVRAM) blocks configured to store data;
a processor; and
logic integrated with and/or executable by the processor, the logic being configured to, for each of the blocks:
  determine, by the processor, a calibration read mode of the given block;
  use, by the processor, the calibration read mode to determine whether pages in the given block should be read using full page read operations;
  in response to determining that the pages in the given block should not be read using full page read operations, determine, by the processor, a current value of a partial page read indicator for the given block;
  calibrate, by the processor, the given block by reading only a portion of each page in the given block, wherein the current value of the partial page read indicator determines which portion of each respective page in the given block is read; and
  increment, by the processor, the current value of the partial page read indicator,
wherein calibrating the given block by reading only a portion of each page in the given block includes, for each page in the given block:
  using the current value of the partial page read indicator to determine which portion of the given page should be read;
  reading the determined portion of the given page; and
  determining a read voltage shift value using results of reading the determined portion of the given page.

* * * * *